(12) United States Patent
Okuno et al.

(10) Patent No.: US 11,131,914 B2
(45) Date of Patent: Sep. 28, 2021

(54) WAVELENGTH CONVERSION MEMBER

(71) Applicant: Panasonic Intellectual Property Management Co., Ltd., Osaka (JP)

(72) Inventors: Tatsuya Okuno, Osaka (JP); Masahiro Nakamura, Osaka (JP); Youshin Lee, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/488,578

(22) PCT Filed: Feb. 26, 2018

(86) PCT No.: PCT/JP2018/006874
§ 371 (c)(1),
(2) Date: Dec. 3, 2019

(87) PCT Pub. No.: WO2018/155671
PCT Pub. Date: Aug. 30, 2018

(65) Prior Publication Data
US 2020/0142288 A1 May 7, 2020

(30) Foreign Application Priority Data

Feb. 27, 2017 (JP) .............................. JP2017-034968
Jun. 28, 2017 (JP) .............................. JP2017-126169

(51) Int. Cl.
*G03B 21/20* (2006.01)
*H01L 33/50* (2010.01)
*G02B 5/20* (2006.01)

(52) U.S. Cl.
CPC .......... *G03B 21/204* (2013.01); *H01L 33/502* (2013.01); *G02B 5/20* (2013.01)

(58) Field of Classification Search
CPC ... G03B 21/204; H01L 33/502; H01L 33/507; H01L 33/60; H01L 33/501; G02B 5/20;
(Continued)

(56) References Cited

U.S. PATENT DOCUMENTS 7,391,046 B2 * 6/2008 Tsutsumi ............... H05B 33/20
257/13
2006/0291226 A1 12/2006 Daicho
(Continued)

FOREIGN PATENT DOCUMENTS

EP         3389100 A1    10/2018
JP       2005-197476 A    7/2005
(Continued)

OTHER PUBLICATIONS

Machine English Translation of JP2015038960A; JP; Tsutai Yoshifumi (Year: 2015).*
(Continued)

*Primary Examiner* — Rajarshi Chakraborty
*Assistant Examiner* — Glenn D Zimmerman
(74) *Attorney, Agent, or Firm* — Renner, Otto, Boisselle & Sklar, LLP

(57) ABSTRACT

A wavelength conversion member includes: a substrate; a wavelength converter including phosphor particles excited by excitation light and a binder layer that fixes or adheres the adjacent phosphor particles to one another, the wavelength converter being provided on a front surface side of the substrate; and a light reflecting film that reflects fluorescent light radiated by the phosphor particles, the light reflecting film being provided on at least a part of an interface between the substrate and the wavelength converter, wherein a refractive index of the phosphor particles is larger than a refractive index of the binder layer. It is preferable that the binder layer
(Continued)

include nanogaps which are voids with an average diameter of 300 nm or less in an inside.

13 Claims, 6 Drawing Sheets

(58) Field of Classification Search
CPC ........ G02B 2207/101; G02B 2207/113; G02B 5/0247; H01S 5/022; C04B 35/553; C09K 11/08
See application file for complete search history.

(56) References Cited

U.S. PATENT DOCUMENTS

| | | | | |
|---|---|---|---|---|
| 2008/0283801 | A1* | 11/2008 | Ryowa | .................... C09K 11/02 |
| | | | | 252/518.1 |
| 2009/0173957 | A1* | 7/2009 | Brunner | ............. C09K 11/7721 |
| | | | | 257/98 |
| 2011/0266569 | A1* | 11/2011 | Basin | .................. H01L 33/0095 |
| | | | | 257/98 |
| 2014/0072812 | A1* | 3/2014 | Hamada | ............. H01S 5/02296 |
| | | | | 428/432 |
| 2015/0171372 | A1 | 6/2015 | Iwata et al. | |
| 2015/0362633 | A1* | 12/2015 | Ishizawa | ................ G02B 1/116 |
| | | | | 359/601 |
| 2016/0343918 | A1* | 11/2016 | Yamada | .................. H01L 33/54 |
| 2017/0023199 | A1* | 1/2017 | Hamada | ................ H01L 33/501 |
| 2017/0045732 | A1* | 2/2017 | Chang | ...................... G02B 5/08 |

FOREIGN PATENT DOCUMENTS

| | | | |
|---|---|---|---|
| JP | 2012-074273 | A | 4/2012 |
| JP | 2013-203822 | A | 10/2013 |
| JP | 2014-019844 | A | 2/2014 |
| JP | 2014-127495 | A | 7/2014 |
| JP | 2015-038960 | A | 2/2015 |
| JP | 2015038960 | A * | 2/2015 |
| JP | 2015-067754 | A | 4/2015 |
| JP | 2015-119046 | A | 6/2015 |
| JP | 2016-115877 | A | 6/2016 |
| JP | 2016-194697 | A | 11/2016 |
| WO | 2009154193 | A1 | 12/2009 |
| WO | 2014/006987 | A | 1/2014 |
| WO | 2017098730 | A1 | 6/2017 |

OTHER PUBLICATIONS

International Search Report for corresponding Application No. PCT/JP2018/006874, dated Apr. 10, 2018.
Written Opinion for corresponding Application No. PCT/JP2018/006874, dated Apr. 10, 2018.

* cited by examiner

WAVELENGTH CONVERSION MEMBER

TECHNICAL FIELD

The present invention relates to a wavelength conversion member using photoluminescence.

BACKGROUND ART

Heretofore, as a wavelength converter using photoluminescence, there has been known a wavelength converter composed of: a plurality of phosphor particles which emit light by being irradiated with excitation light; and a binder layer that holds the plurality of phosphor particles. Moreover, in recent years, the wavelength converter has been desired to be irradiated with excitation light with a high power density in order to improve a light output. For example, excitation light with a high power density of a laser beam source or the like has been being used as the excitation light. Particularly, well known is a mode in which a light reflecting film is provided on an interface between a wavelength converter and a substrate, and is caused to reflect a part of fluorescent light and excitation light, which are generated in the wavelength converter, whereby light extraction efficiency from the wavelength converter is improved.

For example, PTL 1 discloses a method of providing a reflecting layer between a substrate and a wavelength converter composed of a phosphor plate. Moreover, PTL 2 discloses a method of holding phosphor particles on silica by using an oxide precursor.

CITATION LIST

Patent Literature

PTL 1: Japanese Unexamined Patent Application Publication No. 2015-119046
PTL 2: Japanese Unexamined Patent Application Publication No. 2015-38960

SUMMARY OF INVENTION

Technical Problem

However, since the wavelength converter disclosed in PTL 1 uses a phosphor such as YAG, a refractive index of the wavelength converter is as large as, for example, approximately 1.8. Moreover, in the wavelength converter disclosed in PTL 2, a refractive index of a binder layer made of silica or the like is as large as approximately 1.45 to 1.50. Herein, if the refractive index of the wavelength converter itself or the binder layer that covers the phosphor is large as in the wavelength converter disclosed in PTL 1 or PTL 2, then there occurs a problem that in-plane guided light is increased and an output light spot diameter is increased, leading to a decrease of conversion efficiency of the wavelength converter. The in-plane guided light will be described with reference to FIG. 2. FIG. 2 is a schematic cross-sectional view of a conventional wavelength conversion member 100 in which a refractive index of a binder layer 150 is large. Note that pieces of excitation light 60A and 60B illustrated in FIG. 2 are illustrated for the sake of convenience, and usually, it is frequent that only either one of the excitation light 60A and the excitation light 60B is made incident into the wavelength converter 130.

As illustrated in FIG. 2, a part of excitation light 60 that has entered an inside of the wavelength converter 130 and a part of fluorescent light 70 emitted from phosphor particles 140 become in-plane guided light 82 subjected to in-plane guidance while being totally reflected between a light reflecting film 20 and an air interface in the binder layer 150. Herein, the light reflecting film 20 is a light reflecting film that is provided, in order to improve an output and conversion efficiency of the wavelength converter 130, on a surface of a substrate 10 between surfaces thereof, the surface being closer to the wavelength converter 130.

As the light reflecting film 20, there are used: a metal film made of aluminum, silver or the like; a dielectric multilayered film such as a dichroic mirror; and a well-known light reflecting substance. The metal film has a property to absorb a part of light and to convert the light into heat. The dielectric multilayered film has reflectance that depends on an incident angle or a wavelength, and accordingly, has a property not to reflect a part of light but to transmit the part of light therethrough. For the sake of convenience, these properties will be collectively referred to as a light loss in the light reflecting film in the present application. As illustrated in FIG. 2, as being subjected to the in-plane guidance, the in-plane guided light 82 attenuates an intensity thereof since output light 81 is emitted and a light loss 83 occurs in the light reflecting film 20. In FIG. 2, a diameter of output light composed of an aggregate of the output light 81 is conceptually illustrated as an output light spot diameter 90B.

Note that the in-plane guided light 82 is composed of a component having an angle of reflection larger than a critical angle determined by a refractive index step between the binder layer 50 and the air interface and the Snell's law among components which constitute the excitation light 60 and the fluorescent light 70. Therefore, usually, as the refractive index of the binder layer 150 is larger, a ratio at which the output light 81 is generated from the fluorescent light 70 and the like becomes smaller, and a ratio at which the in-plane guided light 82 is generated becomes larger.

From FIG. 2, it is seen that, in the wavelength conversion member 100 in which the ratio of the in-plane guided light 82 is larger than that of the output light 81, a frequency of the light loss 83 in the light reflecting film 20 is high, and accordingly, the intensity of the output light 81 decreases to reduce the conversion efficiency of light, and as a result, light extraction efficiency decreases. Moreover, referring to FIG. 2, in the wavelength conversion member 100 in which the ratio of the in-plane guided light 82 is larger than that of the output light 81, the number of times that the in-plane guided light 82 is reflected in the binder layer 150 is increased, and the output light spot diameter 90B becomes larger. Therefore, it is seen that a power density of the output light is low in the wavelength conversion member 100 in which the ratio of the in-plane guided light 82 is larger than that of the output light 81. Hence, it is seen that both of the light extraction efficiency and the power density of the output light are low in the wavelength conversion member 100 in which the ratio of the in-plane guided light is larger than that of the output light.

Incidentally, in recent years, it has been desired that the wavelength converter and the wavelength conversion member be light sources each having a high power density of the output light, and there has been developed a light source in which a power density of output light is high, the light source using excitation light such as a laser beam having high power and a small spot diameter. However, in the wavelength conversion member including the wavelength converter disclosed in PTL 2, the refractive index of the binder layer is large, and the ratio of the in-plane guided light in the binder layer is large. Therefore, the wavelength conversion member including the wavelength converter disclosed in PTL 2 has had a problem that both of the light extraction efficiency and the power density of the output light are low.

Moreover, the wavelength converters disclosed in PTL 1 and PTL 2 each have had a problem that the power density of the output light is low since the output light spot diameter becomes larger to reduce the conversion efficiency of the wavelength converter as described above.

The present invention has been made in consideration of the above-described problems. It is an object of the present invention to provide a wavelength conversion member in which light extraction efficiency and a power density of output light are high even if being irradiated with excitation light having a high power density.

Solution to Problem

In order to solve the above-described problem, a wavelength conversion member according to an aspect of the present invention includes: a substrate; a wavelength converter including phosphor particles excited by excitation light and a binder layer that fixes or adheres the adjacent phosphor particles to one another, the wavelength converter being provided on a front surface side of the substrate; and a light reflecting film that reflects fluorescent light radiated by the phosphor particles, the light reflecting film being provided on at least a part of an interface between the substrate and the wavelength converter, wherein a refractive index of the phosphor particles is larger than a refractive index of the binder layer.

DESCRIPTION OF EMBODIMENTS

Hereinafter, wavelength conversion members according to embodiments will be described with reference to the drawings.

[Wavelength Conversion Member]

First Embodiment

Figure 1:
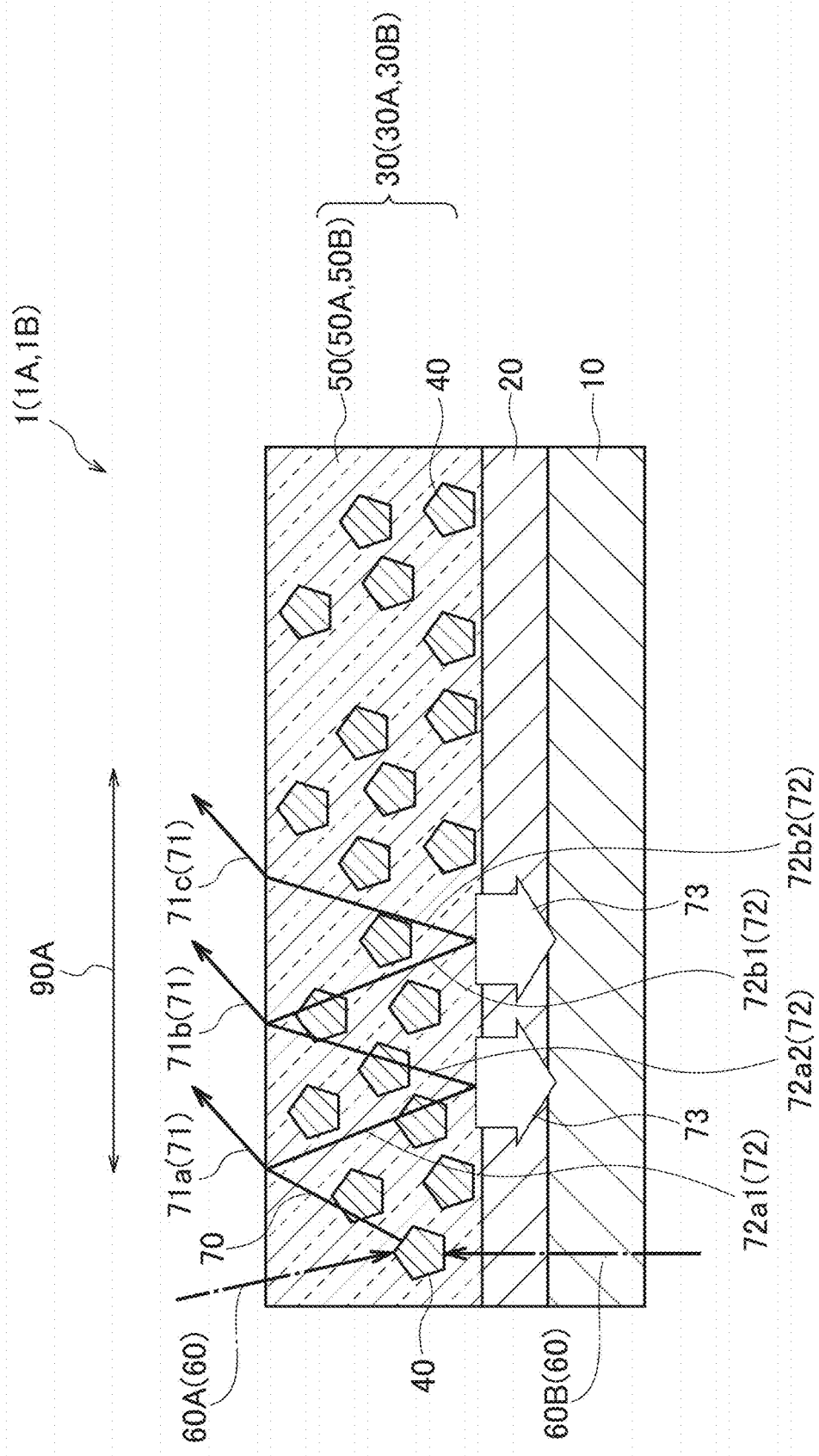
FIG. 1 is a schematic cross-sectional view of wavelength conversion members 1A and 1B according to first and second embodiments, in each of which a refractive index of a binder layer is small.

FIG. 1 is a schematic cross-sectional view of wavelength conversion members 1A and 1B according to first and second embodiments, in each of which a refractive index of a binder layer is small. Note that the wavelength conversion member 1B according to the second embodiment is different from the wavelength conversion member 1A according to the first embodiment in terms of a microscopic structure in a binder layer 50 (50A, 50B). Other structures are the same between the wavelength conversion members 1A and 1B. Therefore, FIG. 1 also illustrates the wavelength conversion member 1B according to the second embodiment together with the wavelength conversion member 1A according to the first embodiment.

Figure 4:
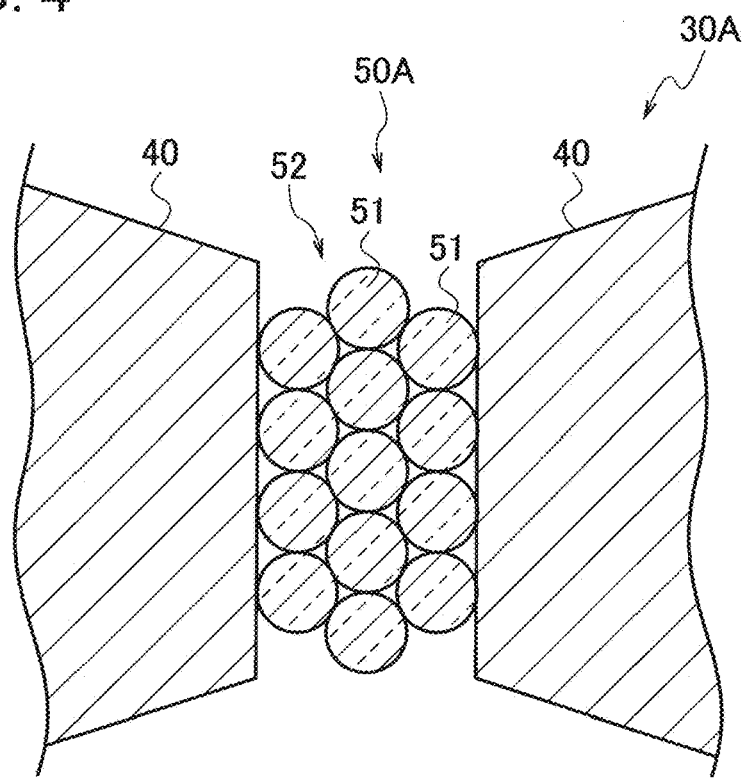
FIG. 4 is a cross-sectional view enlargedly and schematically illustrating a portion A in the wavelength converter 30A of the wavelength conversion member 1A according to the first embodiment illustrated in FIG. 3.

Note that an outline of such a microscopic structure difference between the binder layer 50A that constitutes the wavelength conversion member 1A according to the first embodiment and the binder layer 50B that constitutes the wavelength conversion member 1B according to the second embodiment is as follows. That is, the binder layer 50A that constitutes the wavelength conversion member 1A according to the first embodiment is composed of a fixed body 52 formed by fixing a binder. The binder layer 50A fixes adjacent phosphor particles 40 and 40 to each other. Specifically, as illustrated in FIG. 4, the binder layer 50A is composed of a fixed body 52 of nanoparticles 51. Herein, as will be described later, the fixing means that solids such as nanoparticles are fixed to one another by intermolecular force.

Figure 5:
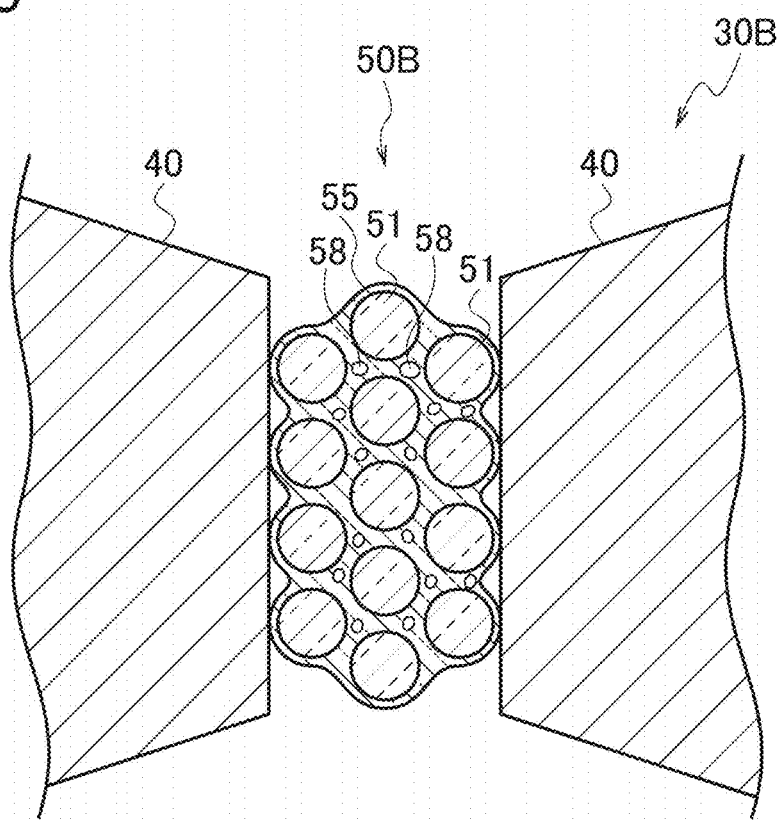
FIG. 5 is a cross-sectional view enlargedly and schematically illustrating a portion A in the wavelength converter 30B of the wavelength conversion member 1B according to the second embodiment illustrated in FIG. 3.

Meanwhile, the binder layer 50B that constitutes the wavelength conversion member 1B according to the second embodiment is composed of a composite hardened body formed by adhesion of the binder. The binder layer 50B adheres the adjacent phosphor particles 40 and 40 to each other. Herein, as will be described later, the adhesion means that solids such as nanoparticles are fixed to one another by force other than the intermolecular force, for example, chemical bonding such as covalent bonding, ion bonding and hydrogen bonding. Specifically, as illustrated in FIG. 5, the binder layer 50B is a layer composed of a composite hardened body including nanoparticles 51 and a fixing assistance substance 55 that bonds adjacent nanoparticles 51 and 51 to each other.

As described above, the binder layer 50A that constitutes the wavelength conversion member 1A according to the first embodiment and the binder layer 50B that constitutes the wavelength conversion member 1B according to the second embodiment are different from each other such that the binder layer 50A is composed of the fixed body in which the binder is fixed and the binder layer 50B is composed of the composite hardened body in which the binder is adhered. However, the microscopic structure difference between the binder layer 50A and the binder layer 50B does not appear in FIG. 1, and accordingly, FIG. 1 collectively illustrates the wavelength conversion member 1A and the wavelength conversion member 1B. Note that the binder layer 50 is a concept involving the binder layer 50A and the binder layer 50B. Therefore, the binder layer 50 can be said to be such a binder layer 50 that fixes or adheres the adjacent phosphor particles 40 and 40 to each other. The wavelength conversion member 1B according to the second embodiment will be described later.

As illustrated in FIG. 1, the wavelength conversion member 1A according to the first embodiment includes a substrate 10, a wavelength converter 30A (30), and a light reflecting film 20. The wavelength conversion member 1A is a member in which the wavelength converter 30A radiates fluorescent light by excitation light radiated by a light emitting element (not illustrated). As the light emitting element, there can be used a well-known light emitting element such as a light emitting element that radiates a laser beam. Preferably, the light emitting element is an element that radiates a laser beam as the excitation light. A reason for this is that, since it is possible to apply excitation light with a high power density to the wavelength conversion member 1A, it is easy to obtain the wavelength conversion member 1A with high light extraction efficiency and with a high power density of output light.

The light reflecting film 20 is a film that is provided on at least a part of an interface between the substrate 10 and the wavelength converter 30A and reflects a part of the fluorescent light 70 radiated by the phosphor particles 40 included in the wavelength converter 30A and reflect a part of the excitation light 60. Herein, "at least a part of an interface between the substrate 10 and the wavelength converter 30A" means "an interface having at least a partial area of a total area of the interface between the substrate 10 and the wavelength converter 30A". That is, the light reflecting film 20 may be formed in a range corresponding to the total area of the interface between the substrate 10 and the wavelength converter 30A, or may be formed in a range corresponding to a part of the area of the interface.

(Substrate)

The substrate 10 reinforces the wavelength converter 30A formed on a surface thereof, and in addition, imparts good optical properties and thermal properties to the wavelength converter 30A by selection of a material and thickness thereof. The light reflecting film 20 is provided on at least a part of the interface between the substrate 10 and the wavelength converter 30A.

As the substrate 10, for example, there are used a translucent one such as glass and sapphire and a non-translucent one such as a metal substrate. As the metal substrate, for example, a metal substrate made of aluminum, copper or the like is used.

When the substrate 10 has translucency, it becomes possible to apply light via the substrate 10 to the phosphor particles 40 in the wavelength converter 30A. Herein, the fact that a material has translucency means that the material is transparent with respect to the visible light (with a wavelength of 380 nm to 800 nm). Moreover, in this embodiment, being transparent means that light transmittance in a material is 80% or more, preferably 90% or more. Moreover, it is preferable that an absorption coefficient for the visible light by the material for use in the substrate 10 be as low as possible since it is possible to sufficiently apply light via the substrate 10 to the phosphor particles 40 in the wavelength converter 30A. As described above, it is preferable that the substrate 10 be made of a material having translucency since it becomes easy to construct a compact system.

When the substrate 10 has translucency, the excitation light 60 is applied like the excitation light 60B to the wavelength converter 30A via the substrate 10 and the light reflecting film 20. Herein, the excitation light 60B means, in the excitation light 60, such excitation light 60 applied to the wavelength converter 30A via the substrate 10 and the light reflecting film 20. Note that the excitation light 60A to be described later means, in the excitation light 60, such excitation light 60 applied to the wavelength converter 30A from an opposite surface of the wavelength converter 30A between surfaces thereof, the opposite surface being remote from the substrate 10.

The light reflecting film 20 is formed so that the excitation light 60B is transmittable via the substrate 10 and the light reflecting film 20 itself by adjusting a film structure and film thickness thereof. Moreover, the light reflecting film 20 may be configured to further have partial translucency by adjusting the film structure and the film thickness. Herein, as will be described later, the partial translucency means a property to allow selective transmission of light with specific wavelength, incident angle and polarization direction.

Moreover, it is preferable that the substrate 10 be a metal substrate since it is easy to improve heat dissipation. That is, if the substrate 10 has high thermal conductivity, then in the wavelength converter 30A, it becomes possible to efficiently remove heat generated in a process where the excitation light 60 (60A) is converted to the fluorescent light 70, and the like. Therefore, it is preferable that thermal conductivity of the substrate 10 be high since it is easy to suppress temperature quenching of the phosphor particles 40 and degradation and burning of the binder layer 50A. When the substrate 10 is a metal substrate, the excitation light 60 is applied to the wavelength converter 30A from the opposite surface of the wavelength converter 30A between the surfaces thereof, the opposite surface being remote from the substrate 10, like the excitation light 60A.

(Wavelength Converter)

The wavelength converter 30A is provided on a front surface side of the substrate 10. Herein, the fact that the wavelength converter 30A is provided on the front surface side of the substrate 10 means that the wavelength converter 30A is provided in a form of being brought into indirect or direct contact with the surface of the substrate 10. Note that the light reflecting film 20 is provided on at least a part of the interface between the wavelength converter 30A and the substrate 10. Therefore, at least a part of the wavelength converter 30A is not usually brought into direct contact with the surface of the substrate 10.

The wavelength converter 30A includes the phosphor particles 40 excited by the excitation light 60 and the binder layer 50A that fixes the adjacent phosphor particles 40 to one another. Usually, the wavelength converter 30A is formed into a film shape in which the phosphor particles 40 are fixed by the binder layer 50A. A film thickness of the wavelength converter 30A is, for example, 10 μm to 1000 μm.

In the wavelength converter 30A, the phosphor particles 40 absorb a part of energy of the excitation light 60 applied thereto, and the phosphor particles 40 emit the fluorescent light 70 with a wavelength different from that of the excitation light 60. As illustrated in FIG. 1, the excitation light 60 may be applied to the wavelength converter 30A via the substrate 10 and the light reflecting film 20 like the excitation light 60B, or may be applied to the wavelength converter 30A from the opposite surface of the wavelength converter 30A between the surfaces thereof, the opposite surface being remote from the substrate 10, like the excitation light 60A.

Note that, the opposite surface of the wavelength converter 30A between the surfaces thereof in the wavelength conversion member 1, the opposite surface being remote from the substrate 10, is a surface being between the surfaces of the wavelength converter 30A and being in contact with air, that is, is a so-called air interface. Moreover, such pieces of the excitation light 60A and 60B illustrated in FIG. 1 are illustrated for the sake of convenience, and usually, it is frequent that only either one of the excitation light 60A and the excitation light 60B is made incident into the wavelength converter 30A.

As described above, when the excitation light 60B is applied to the wavelength converter 30A via the substrate 10 and the light reflecting film 20, usually, a substrate having translucency is used as the substrate 10, and a film having partial translucency, such as a dielectric multilayered film to be described later, is used as the light reflecting film 20. Herein, the partial translucency means such a property to allow selective transmission of light with specific wavelength, incident angle and polarization direction. As the light reflecting film 20 having the partial translucency, for example, a film having characteristics to allow transmission of light in a wavelength band of the excitation light 60B and to reflect light in a wavelength band of the fluorescent light 70 can be suitably used. Moreover, when the excitation light 60A is applied to the wavelength converter 30A from the opposite surface of the wavelength converter 30A between the surfaces thereof, the opposite surface being remote from the substrate 10, usually, a substrate that does not have translucency is used as the substrate 10, and an arbitrary film is used as the light reflecting film 20. Herein, as the arbitrary light reflecting film 20, a metal film, a dielectric multilayered film, a diffusion reflecting film and the like, which will be described later, are used.

A description will be given below of the phosphor particles 40 and the binder layer 50A, which constitute the wavelength converter 30A.

<Phosphor Particle>

The phosphor particles 40 are particles capable of photoluminescence. A type of the phosphor particles 40 is not particularly limited as long as the phosphor particles 40 are capable of photoluminescence and have a refractive index larger than a refractive index of the binder layer 50A. As the phosphor particles, for example, used are crystalline particles with a garnet structure made of YAG, that is, $Y_3Al_5O_{12}$, and phosphor particles made of $(Sr,Ca)AlSiN_3$:Eu.

An average particle size of the phosphor particles is usually 100 μm or less, preferably 30 μm or less. It is preferable that the average particle size of the phosphor particles stay within the above-described range since it is possible to reduce an output light spot diameter 90A because guidance of light trapped in the inside of the phosphor due to total reflection is limited to a range of the particle size. Moreover, it is preferable that the average particle size of the phosphor particles stay within the above-described range since it is possible to produce the phosphor particles in an inexpensive production process such as a coating method while reducing color variation of the output light of the wavelength conversion member 1A.

The average particle size of the phosphor particles is obtained by observing the arbitrarily preprocessed wavelength converter 30A by a scanning electron microscope (SEM) or the like and obtaining an average value of diameters of phosphor particles of which number is sufficiently significant from a statistical viewpoint, for example, 100.

Moreover, it is possible to determine a composition of the phosphor particles by a well-known analysis method such as energy dispersive X-ray analysis (EDX) and X-ray diffraction analysis (XRD).

The phosphor particles may be made of phosphors having the same composition, or may be a mixture of phosphor particles having two or more types of compositions.

The refractive index of the phosphor particles 40 is larger than the refractive index of the binder layer 50A. When the refractive index of the phosphor particles 40 is larger than the refractive index of the binder layer 50A, light is trapped in the inside of the phosphor due to total reflection. Therefore, in in-plane guided light 72 in the binder layer 50A, components limited to the range of the particle size of the phosphor particles 40 are increased. Hence, it is preferable that the refractive index of the phosphor particles 40 be larger than the refractive index of the binder layer 50A since it is easy to reduce the output light spot diameter 90A.

<Binder Layer>

The binder layer 50A constitutes the wavelength converter 30A, is composed of a fixed body to which a binder is fixed, and fixes the adjacent phosphor particles 40 to one another. The binder layer 50A is a substance that fixes a plurality of the phosphor particles 40 to one another. Herein, the fixing means that solids such as nanoparticles are fixed to one another by intermolecular force.

The refractive index of the binder layer 50A is preferably 1.43 or less, more preferably 1.38 to 1.40. Note that a reason why the refractive index of 1.43 or less is preferable is that a refractive index equal to or less than that of silicon resin generally used as a matrix that disperses the phosphor particles is given to the binder layer 50A since the refractive index of the silicon resin is 1.43. When the refractive index of the binder layer 50A is 1.43 or less, a ratio at which the in-plane guided light 72 is generated in the binder layer 50A is reduced, and the light extraction efficiency of the wavelength conversion member 1A is increased, whereby it is possible to reduce the output light spot diameter 90A.

Figure 3:
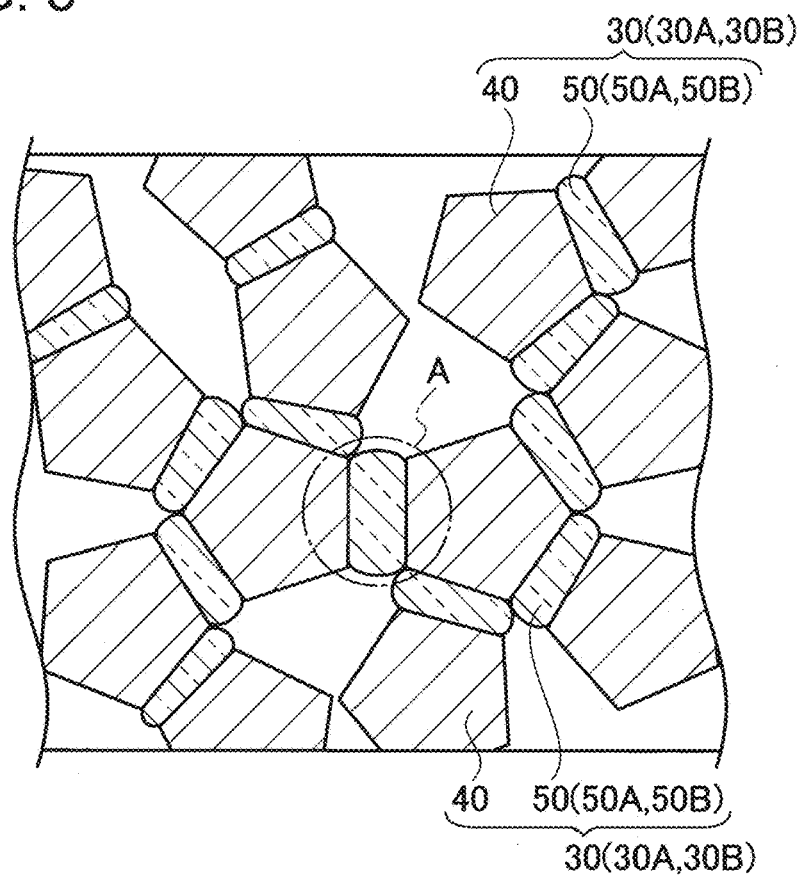
FIG. 3 is a cross-sectional view enlargedly and schematically illustrating a wavelength converter 30 (30A and 30B) illustrated in FIG. 1.

The binder layer 50A will be described with reference to the drawings. FIG. 3 is a cross-sectional view enlargedly and schematically illustrating the wavelength converter 30 (30A and 30B) illustrated in FIG. 1. In the following description, FIG. 3 is used for referring to the wavelength converter 30A illustrated in FIG. 1. FIG. 4 is a cross-sectional view enlargedly and schematically illustrating a portion A in the wavelength converter 30A of the wavelength conversion member 1A according to the first embodiment illustrated in FIG. 3.

As illustrated in FIG. 3 and FIG. 4, the binder layer 50A that constitutes the wavelength converter 30A is composed of the fixed body to which the binder is fixed, and fixes the adjacent phosphor particles 40 and 40 to each other. Specifically, as illustrated in FIG. 4, the binder layer 50A is composed of such a fixed body of the nanoparticles 51.

A material of the binder that forms the binder layer 50A, specifically, a material of the nanoparticles 51 is selected so that the refractive index of the binder layer 50A becomes smaller than the refractive index of the phosphor particles 40. When the refractive index of the binder layer 50A is smaller than the refractive index of the phosphor particles 40, light is trapped in the inside of the phosphor due to total reflection. Therefore, the in-plane guided light 72 in the binder layer 50A includes a large amount of optical component limited to a wavelength region in the range of the particle size of the phosphor particles 40. Hence, it is preferable that the refractive index of the binder layer 50A be smaller than the refractive index of the phosphor particles 40 since it is easy to reduce the output light spot diameter 90A. Moreover, the refractive index of the binder layer 50A is usually larger than 1 that is a refractive index of air.

As a material of the binder layer 50A, specifically, a material of the nanoparticles 51, such an inorganic substance or an organic substance, in which the refractive index of the binder layer 50A becomes smaller than the refractive index of the phosphor particles 40, is preferably used.

It is preferable that the nanoparticles 51 be an inorganic substance in which the refractive index of the binder layer 50A becomes 1.43 or less since a burn due to heat generation of an organic substance does not occur in the binder layer 50A and heat resistance of the binder layer 50A is increased in the case of using excitation light with a high power density, such as a laser beam. That is, it is preferable that the nanoparticles 51 be an inorganic substance in which the refractive index of the binder layer 50A becomes 1.43 or less since the heat resistance of the binder layer 50A is increased. Meanwhile, it is preferable that the nanoparticles 51 be an organic substance in which the refractive index of the binder layer 50A becomes 1.43 or less since it is easy to fabricate a wavelength conversion member in which molding and color of the binder layer 50A vary less. As such an inorganic or organic substance as described above, for example, an inorganic substance in which a refractive index is 1.43 or less or an organic substance in which a refractive index is 1.43 or less is preferably used.

As the inorganic substance in which a refractive index is 1.43 or less, for example, fluoride, $SiO_2$ and the like are used. As the fluoride, for example, there are used magnesium fluoride (refractive index: 1.38); calcium fluoride (refractive index: 1.399), a lithium fluoride (refractive index: 1.392) and the like. In the fluoride, magnesium fluoride is preferable since it is a stable substance, in which a reliability is high, and a refractive index is low.

As the organic substance in which a refractive index is 1.43 or less, for example, organic matter containing fluorine is used. As the organic matter containing fluorine, for example, fluororesin (refractive index: 1.35), fluororubber (refractive index: 1.38) and the like are used. As the fluororesin, for example, polytetrafluoroethylene is used. In the organic matter containing fluorine, the fluororesin is preferable since the refractive index thereof is low.

An average particle size of the nanoparticles 51 is usually 100 nm or less, preferably 50 nm or less. It is preferable that the average particle size of the nanoparticles 51 stay within the above-described range since a fixing strength of the fixed body of the nanoparticles 51 which constitute the binder layer 50A is high. The average particle size of the nanoparticles 51 can be obtained similarly to the average particle size of the phosphor particles.

Moreover, as the nanoparticles 51, either of nanoparticles with a solid structure and nanoparticles with a hollow structure can be used. When the nanoparticles 51 have a hollow structure, a refractive index of hollow portions of the nanoparticles 51 becomes 1.0 that is a refractive index of the atmosphere. Accordingly, the refractive index of the hollow nanoparticles becomes a value between a refractive index of the solid nanoparticles and the refractive index (1.0) of the atmosphere. Therefore, when the nanoparticles 51 have a hollow structure, it is easy for the refractive index of the binder layer 50A to become smaller than the refractive index of the phosphor particles 40, or to become 1.43 or less. As the nanoparticles with a hollow structure, well-known are nanoparticles with a variety of forms such as a core-shell-type form and a through hole-type form. Any of these can be used in the wavelength conversion member 1A of this embodiment.

When the binder layer 50A is composed of the fixed body 52 of the nanoparticles 51, one or more nanogaps which are voids with an average diameter of 300 nm or less may be included in an inside of the fixed body 52 of the nanoparticles 51, for example, between surfaces of the adjacent nanoparticles 51 and 51. Herein, the nanogaps in the binder layer 50A are, in the fixed body 52 in which the surfaces of the adjacent nanoparticles 51 and 51 are bonded to each other, voids with an average diameter of 300 nm or less, which are formed between the surfaces of the nanoparticles 51 and 51 in the fixed body 52 without opening to the surface of the fixed body 52. In FIG. 4, the nanogaps are not illustrated. Note that, when the nanoparticles 51 have a hollow structure, air gaps in the nanoparticles 51 do not apply to the nanogaps.

A refractive index of the nanogaps is 1.0 that is the refractive index of the atmosphere. Therefore, for example, when the nanoparticles 51 of the binder layer 50A are $SiO_2$, an effective refractive index of a fixed body of $SiO_2$ nanoparticles, which includes the nanogaps, that is, the effective refractive index of the binder layer 50A decreases more than the refractive index of the $SiO_2$ nanoparticles 51 themselves. Specifically, the effective refractive index of the binder layer 50A in which the nanoparticles 51 are $SiO_2$ decreases more than the refractive index of the $SiO_2$ nanoparticles 51 themselves due to the presence of the nanogaps, and usually, becomes 1.43 or less. The effective refractive index of the binder layer 50A can be obtained from the Maxwell Garnett formula by using a refractive index and porosity of the material of the binder layer 50A. Moreover, the nanogaps do not have to form a strictly spherical shape.

As described above, when the nanogaps are formed in the inside of the binder layer 50A, it becomes easy to set the effective refractive index to 1.43 or less even if the material of the nanoparticles 51 themselves is larger than 1.43. Therefore, when a method of forming the nanogaps in the inside of the binder layer 50A, options of the material of the nanoparticles 51 are increased, and a degree of freedom in designing the binder layer 50A is improved.

Note that the average diameter of the nanogaps means an average diameter when the nanogaps are assumed to have a spherical shape with the same capacity. The average diameter of the nanogaps is obtained, for example, by a well-known analytical method such as a gas adsorption method. Since the average diameter of the nanogaps is 300 nm or less, the nanogaps affect a refractive index in a visible light region of the binder layer 50A.

The binder layer 50A may include gaps with an average diameter exceeding 300 nm, that is, microgaps which are air gaps with an average diameter larger than that of the nanogaps, and micro impurities which are impurities with an average diameter exceeding 300 nm. For example, the binder layer 50A may include microgaps which are air gaps with an average diameter exceeding 300 nm. Herein, the microgaps in the binder layer 50A are, in the fixed body 52 in which the surfaces of the adjacent nanoparticles 51 and 51 are bonded to each other, voids with an average diameter exceeding 300 nm, which are formed between the surfaces of the nanoparticles 51 and 51 in the fixed body 52 without opening to the surface of the fixed body 52.

The average diameters of the microgaps and the micro impurities are calculated similarly to the average diameter of the nanogaps. The microgaps and the micro impurities have average diameters exceeding 300 nm, and accordingly, have a remarkable effect of scattering light, and therefore, do not affect the refractive index in the visible light region of the binder layer 50A. Therefore, even if the binder layer 50A includes the microgaps and the micro impurities, the effect of this embodiment that the wavelength conversion member in which the light extraction efficiency and the power density of the output light are high is obtained even if being irradiated with excitation light with a high power density is sufficiently obtained.

Moreover, when the binder layer 50A includes appropriate amounts of the microgaps and the micro impurities, the microgaps and the micro impurities scatter the excitation light 60 and the fluorescent light 70 to bring good color mixing properties in the binder layer 50A. Therefore, it is preferable that the binder layer 50A include appropriate amounts of the microgaps and the micro impurities since it is easy to obtain white light with a small color shift.

By the following methods, it is possible to determine whether the microgaps and the micro impurities are present in the binder layer 50A and to measure content ratios of these microgaps and micro impurities therein. That is, it is possible to implement the determination and the measurement by well-known analytical methods such as analysis of a captured image data by an electron microscope and a CT scan method, and as a nitrogen adsorption method, or by a combination of these analytical methods, peripheral technologies or the like.

It is possible to determine the microgaps and the micro impurities in the binder layer 50A by the well-known analytical methods such as the EDX method and the XRD method, or by a combination of these analytical methods, peripheral technologies and the like.

The binder layer 50A may be composed of a luminescent substance, or may be composed of a non-luminescent substance. Herein, the luminescent substance means a substance that emits fluorescent light or phosphorescent light by being excited by excitation light radiated by a light emitting element (not illustrated), or a substance that emits light by light other than the excitation light radiated by the light emitting element. The non-luminescent substance means a substance other than the luminescent substance.

(Light Reflecting Film)

The light reflecting film 20 is a film that is provided on at least a part of the interface between the substrate 10 and the wavelength converter 30A and reflects a part of the fluorescent light 70 radiated by the phosphor particles 40 included in the wavelength converter 30A and reflects a part of the excitation light 60. Usually, the light reflecting film 20 is provided so as to cover at least a part of the surface between the surfaces of the substrate 10, the surface being closer to the wavelength converter 30A. The wavelength conversion member 1A has high light extraction efficiency since the light reflecting film 20 partially reflects the fluorescent light 70 radiated by the phosphor particles 40 in the wavelength converter 30A and the excitation light 60.

The light reflecting film 20 has a light reflectance of 80% or more and less than 100%, preferably 90% or more and less than 100%. In other words, the light reflecting film 20 has a light absorption rate of more than 0% and 20% or less, preferably more than 0% and less than 10%. As the light reflecting film 20, for example, a film of metal such as aluminum and silver and a dielectric multilayered film can be suitably used. Note that aluminum is a material also for use in the substrate 10. When the substrate 10 is aluminum, a part of the surface of the substrate 10 can be regarded as the light reflecting film 20. In the light reflecting film 20, the dielectric multilayered film means a laminated body of optical thin films, which uses plural types of dielectric materials having different refractive indices. Usually, the dielectric multilayered film has partial translucency.

The film thickness of the light reflecting film 20 can be arbitrarily set in response to a target reflectance. For example, when the light reflecting film 20 is a metal film, the film thickness of the light reflecting film 20 is usually 0.1 μm to 1 μm. It is preferable that the film thickness of the light reflecting film 20 composed of the metal film be 0.1 μm to 1 μm since such a light reflecting film 20 having high flatness and uniformity is obtained by an evaporation method and a sputtering method and the like.

Moreover, when the light reflecting film 20 is a diffusion reflecting film, the film thickness of the light reflecting film 20 is usually 1 μm to 1 mm. It is preferable that the film thickness of the light reflecting film 20 be 1 μm to 1 mm since a sufficient reflectance is obtained.

Note that, depending on the case, the light reflecting film 20 and the substrate 10 are sometimes made of the same material. For example, the substrate 10 can be made of aluminum, and the light reflecting film 20 can be made of aluminum. In this case, the aluminum-made substrate 10 and the aluminum-made light reflecting film 20 may be provided separately from each other; however, a part of a surface of the aluminum-made substrate 10 may be regarded as the aluminum-made light reflecting film 20. When a part of the surface of the substrate 10 is regarded as the light reflecting film 20, the film thickness of the light reflecting film 20 is not particularly defined.

<Function of Wavelength Conversion Member>

A function of the wavelength conversion member 1A will be described with reference to FIG. 1. As illustrated in FIG. 1, a part of the excitation light 60 that has entered the inside of the wavelength converter 30A and a part of the fluorescent light 70 emitted from the phosphor particles 40 become the in-plane guided light 72 subjected to the in-plane guidance while being totally reflected between the light reflecting film 20 and the air interface in the binder layer 50A. As being subjected to the in-plane guidance, the in-plane guided light 72 attenuates an intensity thereof since output light 71 is emitted and a light loss 73 occurs in the light reflecting film 20. Specifically, due to the generation of the output light 71 (71a, 71b) and the light loss 73 in the light reflecting film 20, an intensity of the in-plane guided light 72 is attenuated in a descending order of pieces of in-plane guided light 72a1, 72a2, 72b1 and 72b2. In FIG. 1, a diameter of output light composed of an aggregate of the output light 71 (71a, 71b and 71c) is conceptually illustrated as the output light spot diameter 90A.

Note that the in-plane guided light 72 is composed of a component larger than a critical angle determined by a refractive index step between the binder layer 50A and the air interface and the Snell's law among components which constitute the excitation light 60 and the fluorescent light 70. Therefore, usually, as the refractive index of the binder layer 50A is smaller, a ratio at which the in-plane guided light 72 is generated from the fluorescent light 70 and the like becomes smaller. In the wavelength conversion member 1A of this embodiment, the refractive index of the phosphor particles 40 is larger than the refractive index of the binder layer 50A. That is, in the wavelength conversion member 1A, the refractive index of the binder layer 50A is smaller than the refractive index of the phosphor particles 40. Moreover, the refractive index of the binder layer 50A is preferably 1.43 or less. Therefore, in accordance with the wavelength conversion member 1A of this embodiment, the ratio at which the in-plane guided light 72 is generated from the fluorescent light 70 and the like becomes small.

As described in the wavelength conversion member 1A of this embodiment, since the ratio at which the in-plane guided light 72 is generated in the binder layer 50A becomes small, an occurrence frequency of the light loss 73 in the light reflecting film 20 becomes small. Therefore, in accordance with the wavelength conversion member 1A of this embodiment, the light extraction efficiency is improved. Moreover, in the wavelength conversion member 1A, since such a generation ratio of the in-plane guided light 72 is small, the output light spot diameter 90A is reduced as described above. Therefore, in accordance with the wavelength conversion member 1A of this embodiment, the power density of the output light is high. Hence, in accordance with the wavelength conversion member 1A of this embodiment, the wavelength conversion member 1A in which the light extraction efficiency is high and the power density of the output light is high is obtained.

Incidentally, a ratio obtained by dividing a total energy amount of the fluorescent light 70 extracted from the wavelength converter 30A and the excitation light 60 and the output light 71 which are not absorbed by the wavelength converter 30A by an energy amount of the applied excitation light 60 refers to conversion efficiency. The fact that the conversion efficiency is high represents that large output light is obtained by a smaller energy amount. In recent years, in an illumination device, a projector device and the like, it has been desired that the light extraction efficiency is high. In the wavelength conversion member 1A of this embodiment, the light extraction efficiency is high as described above. Accordingly, the wavelength conversion member 1A is suitable for an optical instrument such as an illumination device, a projector device or the like.

Moreover, in the wavelength conversion member 1A, usually, the refractive index of the binder layer 50A that constitutes the wavelength converter 30A is larger than the refractive index of the air. Therefore, in the wavelength conversion member 1A, total reflection occurs on the interface between the wavelength converter 30A and the outside (air), that is, on the air interface. Therefore, a part of the excitation light 60 and a part of the fluorescent light 70 in the inside of the wavelength converter 30A of the wavelength conversion member 1A become the in-plane guided light subjected to the in-plane guidance in the inside of the wavelength converter 30A while repeating the total reflection and the reflection on the light reflecting film 20 as described above.

Figure 2:
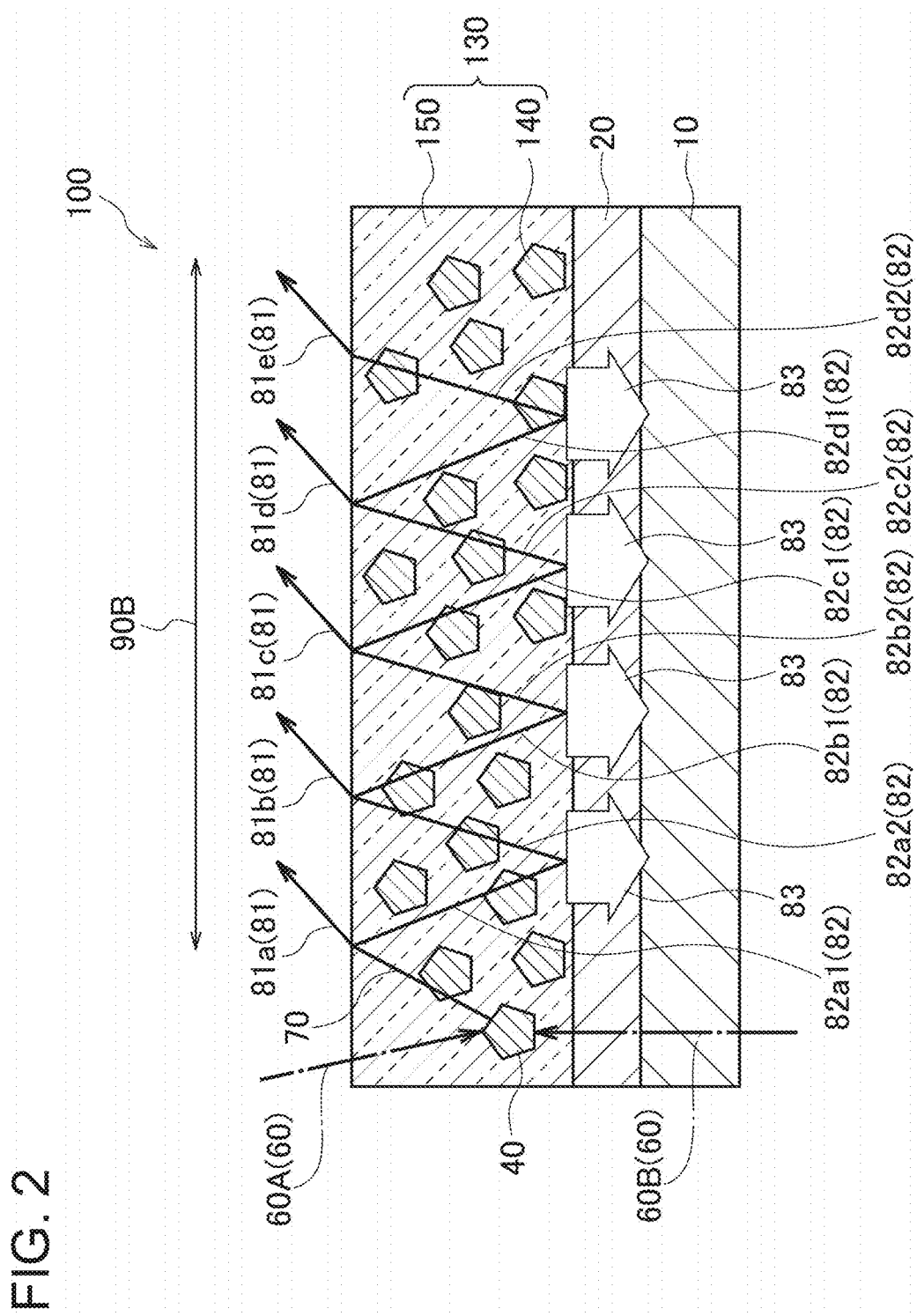
FIG. 2 is a schematic cross-sectional view of a conventional wavelength conversion member 100 in which a refractive index of a binder layer is large.

Note that, as illustrated in FIG. 2, in the conventional wavelength conversion member 100 in which the refractive index of the binder layer 150 is large, an amount of the in-plane guided light 82 is large, and the output light spot diameter 90B becomes large. Therefore, in the conventional wavelength conversion member 100, the power density of the output light decreases by an increase of the spot diameter thereof. In contrast, in the wavelength conversion member 1A of this embodiment, the refractive indices of the binder layer 50A and the phosphor particles 40 have a predetermined relationship, and accordingly, as illustrated in FIG. 1, an amount of the in-plane guided light 72 is small, the output light spot diameter 90A is small, and the power density is high. As described above, in the wavelength conversion member 1A of this embodiment, the power density of the output light is high, and accordingly, the wavelength conversion member 1A is suitable for such an optical instrument such as an illumination device, a projector device or the like.

In the wavelength conversion member 1A of this embodiment, while the generation ratio of the in-plane guided light 72 becomes small, a refractive index difference between the phosphor particles 40 and the binder layer 50A becomes large. Therefore, at a glance, with regard to the wavelength conversion member 1A, it looks as if the light extraction efficiency of the wavelength conversion member 1A were not improved in comparison with the conventional example since the light extraction efficiency from the phosphor particles 40 decreases.

However, the fluorescent light 70 extracted to the binder layer 50A while repeating the total reflection in the inside of the phosphor particles 40 in the wavelength conversion member 1A is hardly affected by a light attenuation function such as the light loss 73 derived from the presence of the light reflecting film 20. That is, such light that is not extracted once from the insides of the phosphor particles 40 due to the reflection on the interface between the phosphor particles 40 and the binder layer 50A is repeatedly reflected in the insides of phosphor particles 40 while changing an angle thereof on interfaces with the binder layer 50A. Then, the light repeatedly reflected in the insides of the phosphor particles 40 is finally extracted to the binder layer 50A while being hardly attenuated.

Note that a spatial propagation range of the light repeatedly reflected in the insides of the above-described phosphor particles 40 is necessarily limited to a particle size range of the phosphor particles 40. Therefore, in the wavelength conversion member 1A, the control of the particle size of the phosphor particles 40 makes it easy to suppress the increase of the spot diameter of the output light. Hence, the wavelength conversion member 1A of this embodiment can reduce the spatial propagation range of the light while suppressing the light loss 73, and accordingly, can obtain higher light extraction efficiency than in the conventional example and a higher power density of the output light than in the conventional example.

<Method for Manufacturing Wavelength Conversion Member>

The wavelength conversion member 1A is manufactured, for example, by forming the wavelength converter 30A on the light reflecting film 20. The wavelength converter 30A can be fabricated by a well-known and arbitrary method including a wet process such as a coating method. The wet process such as a coating method is preferable since production cost is reduced.

(Effect of Wavelength Conversion Member)

In accordance with the wavelength conversion member according to the first embodiment, there is obtained such a wavelength conversion member in which light extraction efficiency and a power density of output light are high even if being irradiated with excitation light having a high power density.

Second Embodiment

Next, a second embodiment will be described. FIG. 1 is a schematic cross-sectional view of the wavelength conversion members 1A and 1B according to the first and second embodiments, in each of which the refractive index of the binder layer is small. Note that FIG. 1 also illustrates the wavelength conversion member 1A according to the first embodiment together with the wavelength conversion member 1B according to the second embodiment. In the following description, FIG. 1 is used for referring to the wavelength conversion member 1B according to the second embodiment.

As illustrated in FIG. 1, the wavelength conversion member 1B according to the second embodiment includes a substrate 10, a wavelength converter 30B (30), and a light reflecting film 20. The wavelength conversion member 1B according to the second embodiment is different from the wavelength conversion member 1A according to the first embodiment in terms of using the binder layer 50B in place of the binder layer 50A. Other structures are the same between the wavelength conversion members 1A and 1B. Therefore, in the following description of the wavelength conversion member 1B according to the second embodiment, the same reference numerals are assigned to the same members as those in the wavelength conversion member 1A according to the first embodiment, and a description of configurations and functions thereof will be omitted as appropriate. That is, the following description will be given mainly of the binder layer 50B.

<Binder Layer>

The binder layer 50B constitutes the wavelength converter 30B, is composed of a composite hardened body formed by adhesion of the binder. The binder layer 50B adheres the adjacent phosphor particles 40 and 40 to each other. The binder layer 50B is a substance that adheres a plurality of the phosphor particles 40 to one another. Herein, the adhesion means that solids such as nanoparticles are fixed to one another by force other than intermolecular force, for example, chemical bonding such as covalent bonding, ion bonding and hydrogen bonding.

The binder layer 50B will be described with reference to the drawings. FIG. 3 is a cross-sectional view enlargedly and schematically illustrating the wavelength converter 30 (30A and 30B) illustrated in FIG. 1. In the following description, FIG. 3 is used for referring to the wavelength converter 30B illustrated in FIG. 1. FIG. 5 is a cross-sectional view enlargedly and schematically illustrating a portion A in the wavelength converter 30B of the wavelength conversion member 1B according to the second embodiment illustrated in FIG. 3.

As illustrated in FIG. 3 and FIG. 5, the binder layer 50B that constitutes the wavelength converter 30B is composed of a composite hardened body formed by adhesion of the binder, and adheres the adjacent phosphor particles 40 and 40 to each other.

Specifically, as illustrated in FIG. 5, the binder layer 50B is composed of a composite hardened body including nanoparticles 51 and a fixing assistance substance 55 that bonds the adjacent nanoparticles 51 and 51 to each other. More specifically, the binder layer 50B composed of a composite hardened body includes the nanoparticles 51 and the fixing assistance substance 55 that covers the nanoparticles 51 and bonds the plurality of nanoparticles 51 while permeating each gap between the adjacent nanoparticles 51 and 51. In the binder layer 50B, the fixing assistance substance 55 covers all the nanoparticles 51 to form the composite hardened body.

Moreover, the fixing assistance substance 55 includes nanogaps 58 which are voids with an average diameter of 300 nm or less therein. Herein, the nanogaps 58 in the binder layer 50B are voids with an average diameter of 300 nm or less, which are formed in the fixing assistance substance 55 without opening to a surface of the fixing assistance substance 55. Note that, when the nanoparticles 51 have a hollow structure, air gaps in the nanoparticles 51 do not apply to the nanogaps.

The binder layer 50B corresponds to a layer formed by causing a raw material of the fixing assistance substance 55 to permeate each gap between the adjacent nanoparticles 51 and 51 and hardening this raw material in the binder layer 50A composed of the fixed body of the nanoparticles 51 of the wavelength conversion member 1A according to the first embodiment.

The binder layer 50B is composed of the composite hardened body including the nanoparticles 51 and the fixing assistance substance 55. Accordingly, a mechanical strength of the binder layer 50B is higher than that of the binder layer 50A composed of the fixed body 52 of the nanoparticles 51 in the wavelength conversion member 1A according to the first embodiment. Therefore, a mechanical strength of the wavelength converter 30B including the binder layer 50B and a peeling strength thereof to the light reflecting film 20 are higher than those of the wavelength converter 30A including the binder layer 50A in the wavelength conversion member 1A according to the first embodiment. For example, since bonding force of the fixed body 52 of the nanoparticles 51 in the binder layer 50A is small, the nanoparticles 51 may be peeled off from the light reflecting film 20 due to collapse of the fixed body 52, and meanwhile, since bonding force of the composite hardened body in the binder layer 50B is large, the nanoparticles 51 of the binder layer 50B are less likely to be peeled off from the light reflecting film 20.

The refractive index of the binder layer 50B is preferably 1.43 or less, more preferably 1.38 to 1.40. When the refractive index of the binder layer 50B is 1.43 or less, a ratio at which the in-plane guided light 72 is generated in the binder layer 50B is reduced, and the light extraction efficiency of the wavelength conversion member 1B is increased, whereby it is possible to reduce the output light spot diameter 90A.

[Fixing Assistance Substance]

The fixing assistance substance 55 is a substance that is loaded together with the nanoparticles 51, thereby improving adhesion of the binder layer 50B itself and adhesion of the binder layer 50B to the phosphor particles and the substrate. The fixing assistance substance 55 improves the mechanical strength of the wavelength converter 30B, for example, resistance of the wavelength converter 30B to scratch and substrate adhesion that is adhesion between the binder layer 50B and the substrate 10. Moreover, when the binder layer 50B contains a substance with high sulfidation, such as silver in addition to the nanoparticles 51, the fixing assistance substance 55 can also develop a function as a gas barrier that protects this substance from sulfidation.

A material of the fixing assistance substance 55 is not particularly limited; however, for example, inorganic matter or organic matter is used. It is preferable that the material of the fixing assistance substance 55 be the inorganic matter since it is possible to increase heat resistance. It is preferable that the material of the fixing assistance substance 55 be organic matter since it is easy to suppress production variations of the wavelength converter 30B. This suppression of the production variations is brought about by the fact that, at the time of forming the wavelength converter 30B by a wet process such as a coating method, a sedimentation rate of the phosphor particles in a raw material coating liquid containing the fixing assistance substance 55 is suppressed, and viscosity of the raw material coating liquid is stabilized.

As the inorganic matter, for example, there is used a substance containing: silica glass ($SiO_2$) using, as a precursor, at least either one of polysilazane and a polysilazane derivative; or silica glass using, as a precursor, at least either one of alkoxysilane and an alkoxysilane derivative.

The silica glass using, as a precursor, at least either one of polysilazane and a polysilazane derivative is obtained by hydrolysis of the precursor. Herein, the polysilazane means a polymer having a cyclic or linear Si—N skeleton structure in which one or more Si—N bonds are continuous, where all of side chains of Si and N are H. Moreover, the polysilazane derivative means a polymer having a structure in which groups other than H, for example, hydrocarbon groups are substituted for one or more side chains or terminal groups which constitute the polysilazane. When at least either one of the polysilazane and the polysilazane derivative is subjected to hydrolysis, the silica glass is obtained. For example, when the polysilazane has a structure of (—SiH$_2$NH—) in molecules, the silica glass SiO$_2$ is generated from (—SiH$_2$NH—) by a hydrolytic reaction.

The silica glass using, as a precursor, at least either one of alkoxysilane and an alkoxysilane derivative is obtained by hydrolytic condensation of the precursor. Herein, the alkoxysilane means a substance in which O in alkoxy groups is bonded to Si. Moreover, the alkoxysilane derivative means a substance with a structure in which groups other than H are substituted for one or more H which constitute the alkoxysilane.

Moreover, the hydrolytic condensation means a reaction in which a hydrolytic reaction and a condensation reaction occur. For example, when the alkoxysilane is Si$_5$O$_4$(OC$_2$H$_5$)$_{12}$, Si$_5$O$_4$(OC$_2$H$_5$)$_{12}$ generates silanol Si$_5$O$_4$(OH)$_{12}$ by the hydrolytic reaction. Moreover, the silanol Si$_5$O$_4$(OH)$_{12}$ generates silica glass SiO$_2$ by the condensation reaction.

The silica glass using, as a precursor, the polysilazane, the polysilazane derivative, the alkoxysilane or the alkoxysilane derivative is produced by a wet process. Therefore, it is preferable that the silica glass using, as a precursor, the polysilazane, the polysilazane derivative, the alkoxysilane or the alkoxysilane derivative be produced since higher film-forming properties than the conventional thin film formation by the sol-gel method are brought about. Moreover, the silica glass (SiO$_2$) using, as a precursor, the polysilazane, the polysilazane derivative, the alkoxysilane or the alkoxysilane derivative is preferable in terms of the light extraction efficiency and the output spot size since a refractive index thereof is relatively low among inorganic metal oxides.

The organic matter that is a material of the fixing assistance substance 55 may be a material partially containing an inorganic component. The organic matter partially containing an inorganic component is preferable since it is easy to increase heat resistance more than pure organic matter.

Moreover, the materials of the fixing assistance substance 55 and the nanoparticles 51 may be identical to each other. It is preferable that the materials of the fixing assistance substance 55 and the nanoparticles 51 be identical to each other since it is easy to increase thermal conductivity of the wavelength converter 30B because phonon scattering is suppressed on interfaces between the fixing assistance substance 55 and the nanoparticles 51.

When the fixing assistance substance 55 covers the surfaces of the nanoparticles 51, a thickness of the fixing assistance substance 55 is usually 1 to 100 nm. Herein, the thickness of the fixing assistance substance 55 means a thickness of the fixing assistance substance 55 that covers surfaces of the nanoparticles 51 located on a surface of the composite hardened body. Such a thickness of the fixing assistance substance 55 being present between the adjacent nanoparticles 51 and 51 is not particularly limited; however, for example, is 1 to 100 nm.

Since the thickness of the fixing assistance substance 55 is small as described above, the fixing assistance substance 55 hardly has an effect of scattering light. Therefore, usually, an optical influence of the fixing assistance substance 55 on the binder layer 50B is only an effective refractive index of the binder layer 50B by the nanogaps 58 in the inside of the fixing assistance substance 55.

Note that in the binder layer 50B illustrated in FIG. 5, the fixing assistance substance 55 covers all the nanoparticles 51 and forms the composite hardened body. However, as a modified example of the embodiment illustrated in FIG. 5, the fixing assistance substance 55 may form a composite hardened body in which the fixing assistance substance 55 partially covers the nanoparticles 51. Herein, "the fixing assistance substance 55 partially covers the nanoparticles 51" means that partial pieces of the nanoparticles 51 which constitute the binder layer 50 among all pieces thereof are not covered with the fixing assistance substance 55.

The fixing assistance substance 55 of the binder layer 50B includes the nanogaps 58 which are voids with an average diameter of 300 nm or less therein. A refractive index of the nanogaps 58 is 1.0 that is the refractive index of the atmosphere. Therefore, for example, when the nanoparticles 51 of the binder layer 50B are SiO$_2$, an effective refractive index of the composite hardened body including the SiO$_2$ nanoparticles 51 and the fixing assistance substance 55 including the nanogaps 58, that is, an effective refractive index of the binder layer 50B decreases more than the refractive index of the SiO$_2$ nanoparticles 51 themselves. Specifically, the effective refractive index of the binder layer 50B in which the nanoparticles 51 are SiO$_2$ decreases more than the refractive index of the SiO$_2$ nanoparticles 51 themselves due to the presence of the nanogaps 58, and usually, becomes 1.43 or less. The effective refractive index of the binder layer 50B can be obtained from the Maxwell Garnett formula by using a refractive index and porosity of the material of the binder layer 50B. Moreover, the nanogaps 58 do not have to form a strictly spherical shape. Hence, in accordance with the binder layer 50B composed of the composite hardened body including the nanoparticles 51 and the fixing assistance substance 55 including the nanogaps 58, it is easy to increase the mechanical strength of the wavelength converter 30B while reducing the effective refractive index of the binder layer 50B.

Among materials of a binder that forms the binder layer 50B, as a material of the nanoparticles 51, such an inorganic substance or an organic substance, in which the refractive index of the binder layer 50B becomes smaller than the refractive index of the phosphor particles 40, is preferably used.

Moreover, as a material of the nanoparticles 51, such an inorganic substance or an organic substance, in which the refractive index of the binder layer 50B becomes smaller than the refractive index of the phosphor particles 40 by constituting the binder layer 50B in combination with the fixing assistance substance 55, is preferably used. As the material of the nanoparticles 51 which constitute the binder layer 50B, the same one as the material of the nanoparticles 51 which constitute the binder layer 50A of the wavelength conversion member 1A according to the first embodiment can be used. Therefore, a description of the material of the nanoparticles 51 which constitute the binder layer 50B will be omitted.

Among the materials of the binder that forms the binder layer 50B, as a material of the fixing assistance substance 55, an inorganic substance in which the refractive index of the binder layer 50B becomes smaller than the refractive index of the phosphor particles 40, is preferably used.

When the refractive index of the binder layer 50B is smaller than the refractive index of the phosphor particles 40, light is trapped in the insides of the phosphor particles 40 due to total reflection, and the trapped light includes much of a light component limited within a range of the particle size of the phosphor particles 40. Hence, it is preferable that the refractive index of the binder layer 50B be smaller than the refractive index of the phosphor particles 40 since it is easy to reduce the output light spot diameter 90A. Moreover, the refractive index of the binder layer 50B is usually larger than 1 that is the refractive index of air.

Moreover, among the materials of the binder layer 50B, as a material of the fixing assistance substance 55, such an inorganic substance in which the refractive index of the binder layer 50B becomes smaller than the refractive index of the phosphor particles 40 by constituting the binder layer 50B in combination with the nanoparticles 51, is preferably used. As the inorganic substance that constitutes the fixing assistance substance 55, for example, a silicon compound such as silica, which has the $SiO_2$ skeleton structure, is used.

Note that, when the fixing assistance substance 55 is the silicon compound having the $SiO_2$ skeleton structure, a refractive index of $SiO_2$ itself is approximately 1.44 to 1.50. However, as illustrated in FIG. 5, the binder layer 50B usually includes the nanogaps 58 which are voids with an average diameter of 300 nm or less in the inside of the fixing assistance substance 55. A refractive index of the nanogaps 58 is 1.0 that is the refractive index of the atmosphere. Therefore, an effective refractive index of the fixing assistance substance 55 including the nanogaps 58 decreases more than the refractive index of $SiO_2$ itself, and usually becomes 1.43 or less. Moreover, an effective refractive index of the binder layer 50B including the nanoparticles 51 and the fixing assistance substance 55 including the nanogaps 58 usually becomes 1.43 or less when the refractive index of the material of the nanoparticles 51 is 1.43 or less. The effective refractive index of the binder layer 50B can be obtained from the Maxwell Garnett formula by using the refractive index and content ratio of each of the nanoparticles 51, the nanogaps 58 and the fixing assistance substance 55. Moreover, the nanogaps 58 and the nanoparticles 51 do not have to form a strictly spherical shape.

By the following methods, it is possible to determine whether the nanoparticles 51, the nanogaps 58 and the fixing assistance substance 55 are present in the binder layer 50B and to measure the content ratios of these. That is, it is possible to implement the determination and the measurement by well-known analytical methods such as analysis of a captured image data by an electron microscope and a CT scan method, and as a nitrogen adsorption method, or by a combination of these analytical methods, peripheral technologies or the like.

It is possible to determine the nanoparticles 51 and the fixing assistance substance 55 in the binder layer 50B by the well-known analytical methods such as the EDX method and the XRD method, or by a combination of these analytical methods, peripheral technologies and the like.

Note that the average diameter of the nanogaps 58 means an average diameter when the nanogaps 58 are assumed to have a spherical shape with the same capacity. The average diameter of the nanogaps 58 is obtained, for example, by a well-known analytical method such as a gas adsorption method. The nanogaps 58 have an average diameter of 300 nm or less, and accordingly, hardly have an effect of scattering light, and therefore, affect the refractive index in the visible light region of the binder layer 50B.

The binder layer 50B may include gaps with an average diameter exceeding 300 nm, that is, microgaps which are air gaps with an average diameter larger than that of the nanogaps 58, and micro impurities which are impurities with an average diameter exceeding 300 nm. For example, the binder layer 50B may include microgaps which are air gaps with an average diameter exceeding 300 nm. Herein, the microgaps in the binder layer 50B are voids with an average diameter exceeding 300 nm, which are formed in the fixing assistance substance 55 without opening to the surface of the fixing assistance substance 55.

The average diameters of the microgaps and the micro impurities are calculated similarly to the average diameter of the nanogaps 58. The microgaps and the micro impurities have average diameters exceeding 300 nm, and accordingly, have a remarkable effect of scattering light, and therefore, do not affect the refractive index in the visible light region of the binder layer 50B. Therefore, even if the binder layer 50B includes the microgaps and the micro impurities, the effect of this embodiment that the wavelength conversion member in which the light extraction efficiency and the power density of the output light are high is obtained even if being irradiated with excitation light with a high power density is sufficiently obtained.

Moreover, when the binder layer 50B includes appropriate amounts of the microgaps and the micro impurities, the microgaps and the micro impurities scatter the excitation light 60 and the fluorescent light 70 to bring good color mixing properties in the binder layer 50B. Therefore, it is preferable that the binder layer 50B include appropriate amounts of the microgaps and the micro impurities since it is easy to obtain white light with a small color shift.

The measurement whether the microgaps and the micro impurities are present in the binder layer 50B and of the content ratios thereof are similar to the measurement whether the microgaps and the micro impurities are present in the binder layer 50A and of the content ratios thereof.

The determination of the microgaps and the micro impurities in the binder layer 50B are similar to the determination of the microgaps and the micro impurities in the binder layer 50A.

The binder layer 50B may be composed of a luminescent substance, or may be composed of a non-luminescent substance. Herein, the luminescent substance and the non-luminescent substance mean the same substances as the luminescent substance and the non-luminescent substance which are described in the binder layer 50A that constitutes the wavelength conversion member 1A according to the first embodiment.

Moreover, the nanogaps 58 included in the binder layer 50B are provided in the binder layer 50B so that the content thereof causes the refractive index of the binder layer 50B to become smaller than the refractive index of the phosphor particles 40.

Note that, when a difference in thermal expansion coefficient between a binder layer and a substrate is large in the conventional wavelength conversion member, the wavelength converter may be peeled off from the substrate due to a thermal impact and the like. In contrast, in accordance with the wavelength conversion member 1B according to the second embodiment, the fixing assistance substance 55 adjusts a thermal expansion coefficient of the binder layer 50B, and accordingly, it is possible to reduce such a possibility of the above-described peeling. For example, when the binder layer 50B is composed of inorganic matter with a relatively low thermal expansion coefficient, and the substrate 10 is composed of metal with a relatively large thermal expansion coefficient, the possibility of the above-described peeling can be effectively reduced.

With regard to the binder layer 50B composed of the composite hardened body using the nanoparticles 51 and the fixing assistance substance 55 in combination, it is easy to increase a volume of the binder layer 50B to be loaded between the phosphor particles 40 in comparison with the case of using an inorganic precursor as the binder layer as in PTL 2. Therefore, in accordance with the binder layer 50B, it becomes easy to increase a distance between the phosphor particles 40, and as a result, it becomes easy to reduce the number of phosphor particles per unit volume of the wavelength converter 30B. This wavelength converter 30B in which the number of phosphor particles per unit volume is small is suitable in the case where the color shift is apt to be increased since the wavelength converter 30B has high dependency on an irradiated position, like the case of using, as excitation light, a laser beam or the like having a relatively small spot diameter. A reason for this is that the above-described wavelength converter 30B in which the number of phosphor particles per unit volume is small makes it easy to absorb the chromaticity shift of the output light, which is caused depending on the irradiated position with the excitation light. Hence, the wavelength conversion member 1B including the binder layer 50B is suitable for a light emitting device in which the color shift is apt to be increased since the wavelength converter 30B has high dependency on the irradiated position because a laser beam or the like having a relatively small spot diameter is used as excitation light.

<Function of Wavelength Conversion Member>

A function of the wavelength conversion member 1B according to the second embodiment is similar to the function of the wavelength conversion member 1A according to the first embodiment, and a description thereof will be omitted.

<Method for Manufacturing Wavelength Conversion Member>

The wavelength conversion member 1B is manufactured, for example, by forming the wavelength converter 30B on the light reflecting film 20. For example, the wavelength converter 30B can be fabricated by using raw materials of the phosphor particles 40, the nanoparticles 51 and the fixing assistance substance and hardening the raw material of the fixing assistance substance by the sol-gel method.

(Effect of Wavelength Conversion Member)

In accordance with the wavelength conversion member according to the second embodiment, like the wavelength conversion member according to the first embodiment, there is obtained such a wavelength conversion member in which light extraction efficiency and a power density of output light are high even if being irradiated with excitation light having a high power density.

Moreover, a mechanical strength and peeling strength of the binder layer 50B of the wavelength conversion member according to the second embodiment are higher than those of the binder layer 50A of the wavelength conversion member according to the first embodiment. Therefore, in accordance with the wavelength conversion member 1B according to the second embodiment, the mechanical strength of the wavelength converter 30B including the binder layer 50B and the peeling strength thereof to the light reflecting film 20 are higher than those of the wavelength conversion member 1A according to the first embodiment.

Binder Layers of First and Second Embodiments

On the basis of the binder layer 50A of the wavelength conversion member 1A according to the above-described first embodiment and the binder layer 50B of the wavelength conversion member 1B according to the above-described second embodiment, it can be said that the binder layer 50 fixes or adheres the adjacent phosphor particles 40 and 40 to each other.

Modified Example of Second Embodiment

In the wavelength conversion member 1B according to the above-described second embodiment, the binder layer 50B is composed of the composite hardened body including the nanoparticles 51 and the fixing assistance substance 55 that bonds the adjacent nanoparticles 51 and 51 to each other. In contrast, as a modified example of the wavelength conversion member 1B according to the second embodiment, the binder layer 50 can be formed as a composite hardened body composed of only the fixing assistance substance 55 that does not include the nanoparticles 51. Moreover, the composite hardened body composed of only the fixing assistance substance 55 that constitutes the binder layer 50 can include the nanogaps 58 therein like the wavelength conversion member 1B according to the second embodiment.

<Function of Wavelength Conversion Member>

A function of the wavelength conversion member according to the modified example of the second embodiment is similar to the function of the wavelength conversion member 1B according to the second embodiment, and a description thereof will be omitted.

<Method for Manufacturing Wavelength Conversion Member>

The wavelength converter of the wavelength conversion member according to the modified example of the second embodiment can be fabricated by a well-known and arbitrary method including a wet process such as a coating method. The wet process such as a coating method is preferable since production cost is reduced.

(Effect of Wavelength Conversion Member)

In accordance with the wavelength conversion member according to the modified example of the second embodiment, there is obtained such a wavelength conversion member in which light extraction efficiency and a power density of output light are high even if being irradiated with excitation light having a high power density.

EXAMPLES

Hereinafter, this embodiment will be described more in detail by examples; however, this embodiment is not limited to these examples.

Example 1

(Fabrication of Wavelength Conversion Member)

Powder of magnesium fluoride nanoparticles (refractive index: 1.38) with an average particle size of 40 nm, which was produced by a gas phase method, was mixed with ion exchange water, and was dispersed by an ultrasonic wave, whereby 15 mass % of a magnesium fluoride dispersion liquid D1 was obtained.

Moreover, as a yellow green phosphor, prepared was YAG particles (YAG374A165 made by Nemoto Lumi-Materials Co., Ltd.; refractive index: 1.8) with an average particle size of 19 μm. Furthermore, as a red phosphor, prepared was SCASN particles (BR-102 made by Mitsubishi Chemical Corporation; refractive index>1.8) with an average particle size of 10 μm. The SCASN particles are a $(Sr,Ca)AlSiN_3$:Eu phosphor. The magnesium fluoride dispersion liquid D1, the YAG particles and the SCASN particles were mixed together in a weight ratio of 1:2.1:0.18, whereby a fluorescent liquid P1 was obtained.

Next, on a part of a surface of an aluminum substrate with a reflectance of 95%, an Ag film as a light reflecting film was deposited to a thickness of 120 nm, whereby a substrate member composed of the aluminum substrate and the Ag film was fabricated. In the substrate member, the Ag film was deposited so that an area thereof became smaller than an area of the surface of the aluminum substrate. Then, an applicator equipped with a metal-made bar was used, and the metal-made bar was driven at a speed of 4 mm/s, whereby the fluorescent liquid P1 was coated on the Ag film of the substrate member. This was dried at room temperature. Then, a wavelength conversion member (wavelength conversion member No. 1) in which a wavelength converter (wavelength converter No. 1) was formed on the substrate member was obtained. In the wavelength converter No. 1, the YAG particles and the SCASN particles were fixed by a binder layer, and the binder layer was formed as a fixed body in which magnesium fluoride nanoparticles were fixed to one another. A refractive index of the binder layer was approximately 1.38 or less. The wavelength conversion member No. 1 was a member in which the wavelength converter No. 1 was formed on the light reflecting film formed on a part of the surface of the aluminum substrate.

Note that, at the time of coating the fluorescent liquid P1, the substrate member was fixed on a stage of the applicator by being pasted thereon by a fixing tape with a thickness of 100 μm. Moreover, at the time of coating the fluorescent liquid P1, the fluorescent liquid P1 was coated in such a manner that an appropriate amount thereof was dropped on a portion surrounded by the fixing tape and the surface of the substrate member, and thereafter, the metal-made bar was rolled to thrust such a coated object obtained by dropping the fluorescent liquid P1 on the substrate member.

(Evaluation for Conversion Efficiency of Wavelength Conversion Member)

The wavelength conversion member No. 1 was pasted to a metal-made heat sink so that the substrate thereof was brought into contact therewith. Next, a laser beam with a central wavelength of 450 nm and a power density of approximately 4.5 W/mm² was applied as excitation light to the surface of the wavelength converter No. 1. Then, a mixed color composed of blue light, yellow green light and red light of the excitation light was obtained.

For this mixed color, a wavelength spectrum and an illumination intensity were measured by using an integrating sphere, a spectrophotometer and an illuminometer, whereby an energy amount of the mixed color was obtained. The energy amount of the mixed color was calculated by integrating energy in a region where a wavelength ranges from 380 nm to 800 nm.

Next, the energy amount of the mixed color was divided by an energy amount of the excitation light, whereby conversion efficiency was calculated. This conversion efficiency was also calculated in Example 2 to be described later in a similar way to this example. Then, the conversion efficiency of this example (Example 1) was divided by the conversion efficiency of Example 2, whereby a conversion efficiency ratio was calculated. The conversion efficiency ratio is shown in Table 1. Note that the conversion efficiency and the conversion efficiency ratio are indices which indicate that light extraction efficiency of the wavelength conversion member is higher as numerical values thereof are higher.

TABLE 1

|  | Conversion Efficiency Ratio |
| --- | --- |
| Example 1 | 1.06 |
| Example 2 | 1.00 |

Example 2

(Fabrication of Wavelength Conversion Member)

Polysilazane (Merck K.K., NL120A), YAG particles similar to those of Example 1 and SCASN particles similar to those of Example 1 were prepared. The polysilazane, the YAG particles and the SCASN particles were mixed together in a weight ratio of 1:2.1:0.18, whereby a fluorescent liquid P51 was obtained. As the polysilazane, Aquamica (registered trademark) NL120A made by Merck Performance Materials Ltd. was used. Aquamica NL120A contained a palladium-based catalyst that accelerates silica conversion, where a solvent was a mixed solvent of dibutyl ether and anisole.

Then, in a similar way to Example 1 except for using the fluorescent liquid P51 in place of the fluorescent liquid P1, a wavelength conversion member (wavelength conversion member No. 51) in which a wavelength converter (wavelength converter No. 51) was formed on a substrate was obtained. The wavelength converter No. 51 was formed as one in which the YAG particles and the SCASN particles were adhered to each other by a binder layer. The binder layer was formed as a fixing assistance substance composed of silica, where a refractive index was 1.38 or more and less than 1.50, and an average value thereof was 1.45. The wavelength conversion member No. 51 was a member in which the wavelength converter No. 51 was formed on the light reflecting film formed on a part of the surface of the aluminum substrate.

(Evaluation of Conversion Efficiency of Wavelength Conversion Member)

Conversion efficiency and a conversion efficiency ratio were calculated in a similar way to Example 1. The conversion efficiency ratio is illustrated in Table 1.

Evaluation Comparison Between Example 1 and Example 2

<Comparison of Conversion Efficiency Ratio>

From Table 1, it was found that the conversion efficiency ratio of Example 1 was higher than the conversion efficiency ratio of Example 2. That is, it was found that the light extraction efficiency of Example 1 was higher in comparison with the light extraction efficiency of Example 2.

<Relationship Between Conversion Efficiency and Refractive Index of Binder Layer>

A main difference between Example 1 and Example 2 is a composition of the binder layer. In accordance with the comparison between the conversion efficiency ratios of Example 1 and Example 2, such an improvement of the conversion efficiency of Example 1 with respect to that of Example 2 is considered to be brought about from a difference therebetween in terms of the composition of the binder layer. Specifically, the binder layer of Example 2 is silica (refractive index: 1.45) derived from polysilazane, and the binder layer of Example 1 is a magnesium fluoride fixed body and nanogaps (refractive index: 1.2). Therefore, in Example 1, the conversion efficiency is considered to be improved by the decrease of the refractive index of the binder layer.

Example 3

(Fabrication of Wavelength Conversion Member)

1 mass part of powder of magnesium fluoride nanoparticles (refractive index: 1.38) with an average particle size of 40 nm, which was produced by a gas phase method, and 9 mass part of polysilazane were mixed with each other, and was dispersed by an ultrasonic wave, whereby a magnesium fluoride dispersion liquid D2 was obtained. As the polysilazane, Aquamica (registered trademark) NL120A made by Merck Performance Materials Ltd. was used. Aquamica NL120A contained a palladium-based catalyst that accelerates silica conversion, where a solvent was a mixed solvent of dibutyl ether and anisole.

Moreover, YAG particles as a yellow green phosphor and SCASN particles as a red phosphor, which were identical to those of example 1, were prepared. The magnesium fluoride dispersion liquid D2, the YAG particles and the SCASN particles were mixed together in a weight ratio of 1:2.1:0.18, whereby a fluorescent liquid P2 was obtained.

In a similar way to Example 1 except for using the fluorescent liquid P2 in place of the fluorescent liquid P1, a wavelength conversion member (wavelength conversion member No. 2) in which a wavelength converter (wavelength converter No. 2) was formed on a substrate was obtained. A plurality of the wavelength conversion members No. 2 were fabricated. As seen from observation results to be described later, the wavelength converter No. 2 was formed as one in which the YAG particles and the SCASN particles were adhered to each other by a binder layer. A refractive index of the binder layer was 1.38 or more and less than 1.50, where an average value thereof was 1.42. The wavelength conversion member No. 2 was a member in which the wavelength converter No. 2 was formed on the light reflecting film formed on a part of the surface of the aluminum substrate.

(Observation of Wavelength Converter)

Figure 6:
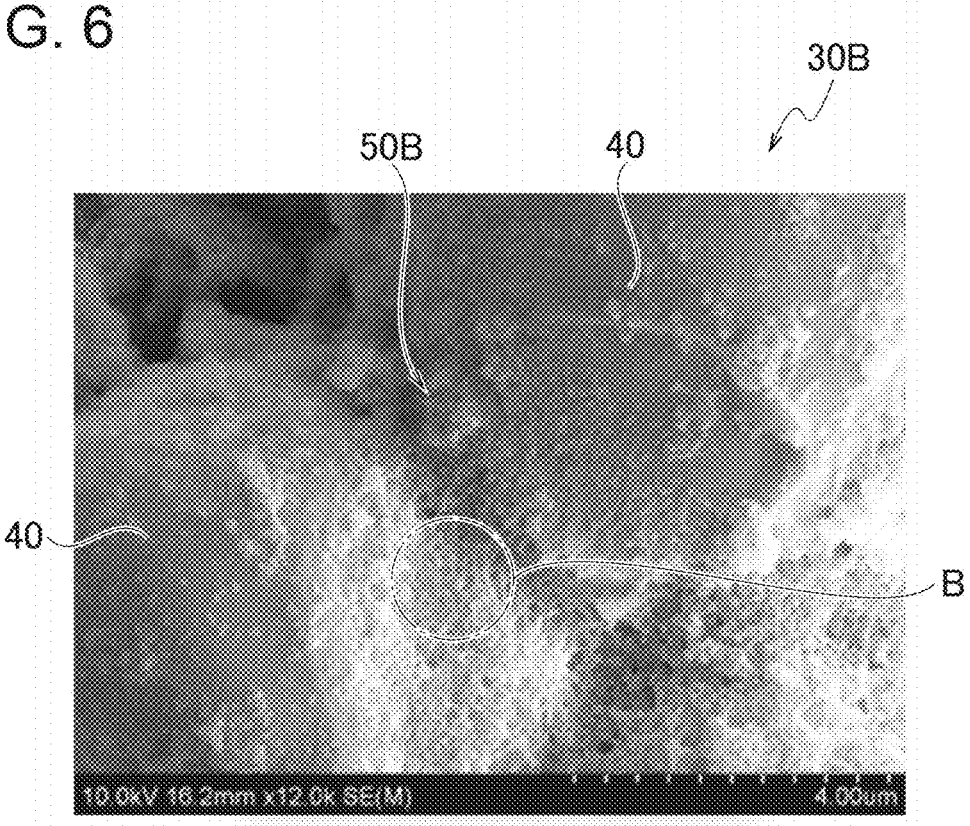
FIG. 6 is a scanning electron microscope (SEM) picture illustrating a fracture surface of the wavelength converter 30B that constitutes a wavelength conversion member according to Example 3.
Figure 7:
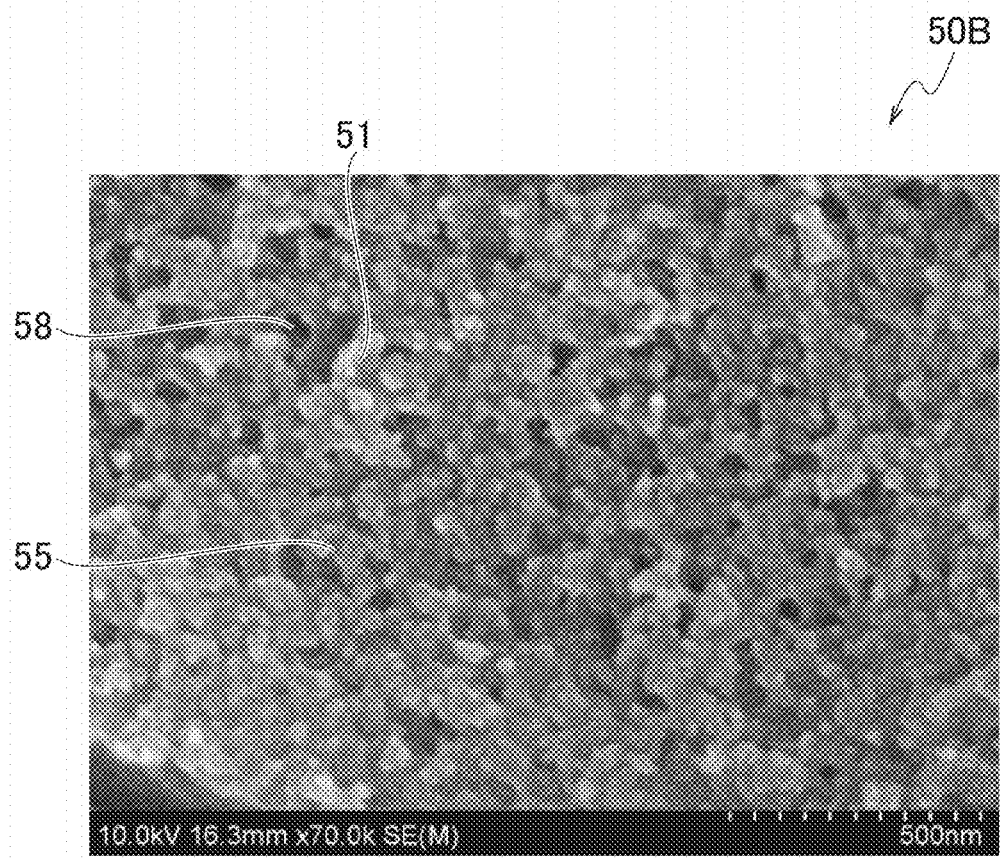
FIG. 7 is a SEM picture enlargedly illustrating a portion B of FIG. 6.

With regard to the obtained wavelength conversion member No. 2, the wavelength converter No. 2 on the substrate was fractured. For such a fracture surface of this wavelength converter No. 2, a scanning electron microscope (SEM) picture was taken by using an FE-SEM. A result is shown in FIG. 6 and FIG. 7. FIG. 6 is a scanning electron microscope (SEM) picture illustrating the fracture surface of the wavelength converter No. 2 that constitutes the wavelength conversion member No. 2 according to Example 3. FIG. 7 is a SEM picture enlargedly illustrating a portion B of FIG. 6.

As illustrated in FIG. 6, the wavelength converter No. 2 (displayed as 30B in FIG. 6) was formed as one in which the phosphor particles 40 composed of the YAG particles and the SCASN particles were adhered to one another by the binder layer 50B. Moreover, it was found that, as illustrated in FIG. 7, the binder layer 50B was composed of a composite hardened body including the nanoparticles 51 made of magnesium fluoride ($MgF_2$) and the fixing assistance substance 55 that bonds the adjacent nanoparticles 51 and 51 to each other and was made of silica. Moreover, it was found that the fixing assistance substance 55 includes the nanogaps 58 therein.

(Evaluation of Nanogap)

For the wavelength conversion members (wavelength conversion members No. 1 and No. 2) of Example 1 and Example 3, a gap diameter (nm) and log differential pore capacity distribution of the air gaps included in each of the binder layers were measured in the following manner.

First, a small amount of each of the wavelength converters (wavelength converters No. 1 and No. 2) of the wavelength conversion members (wavelength conversion members No. 1 and No. 2) of Example 1 and Example 3 was crushed to prepare a powder sample. The powder sample of Example 1 included: the phosphor particles composed of the YAG particles and the SCASN particles; and the nanoparticles which constitute the binder layer. The powder sample of Example 3 included: the phosphor particles composed of the YAG particles and the SCASN particles; the nanoparticles which constitute the binder layer; and the fixing assistance substance.

Moreover, as Reference example 1, a powder sample was prepared, in which the YAG particles and the SCASN particles, which were used in Example 1 and Example 3, were blended in the same blending ratio as those in Example 1 and Example 3. This powder sample was composed of only the phosphor particles, and did not contain the substance that constitutes the binder layer. Reference example 1 corresponds to a blank sample with respect to Example 1 and Example 3.

Next, by a nitrogen adsorption method, gap diameters (nm) and log differential pore capacity distributions of the air gaps in the powder samples of Example 1, Example 3 and Reference example 1 were measured. Results are illustrated in FIG. 8.

Figure 8:
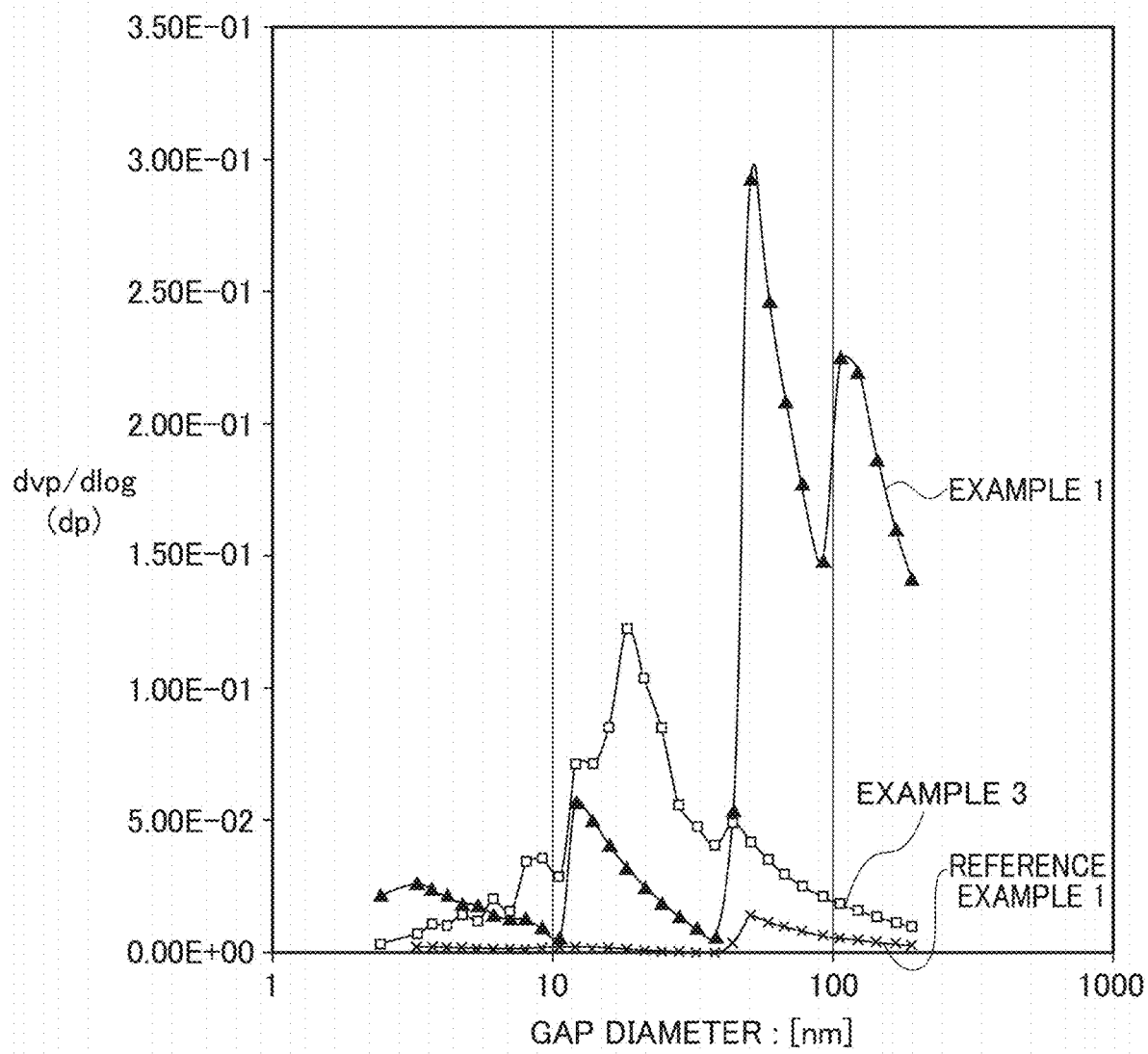
FIG. 8 is a graph illustrating relationship between a gap diameter and a log differential pore capacity distribution in nanogaps in examples and a reference example.

It was found that, as illustrated in FIG. 8, the powder sample of Example 1 included nanogaps which are air gaps with an average diameter of 300 nm or less, in which the most common value of the gap diameters is approximately 50 (nm). Moreover, it was found that the powder sample of Example 1 included an extremely large amount of the nanogaps since a log differential pore capacity thereof was extremely large.

It was found that the powder sample of Example 3 included nanogaps which are air gaps with an average diameter of 300 nm or less, in which the most common value of the gap diameters is approximately 20 (nm). Moreover, it was found that the powder sample of Example 3 included a somewhat large amount of the nanogaps since a log differential pore capacity thereof was somewhat large.

It was found that the powder sample of Reference example 1 included nanogaps which are air gaps with an average diameter of 300 nm or less, in which the most common value of the gap diameters is approximately 50 (nm). However, it was found that this was caused by noise during the measurement or an unintended substance such as dust contained in the powder sample, and that the powder sample of Reference example 1 did not substantially include the nanogaps since the log differential pore capacity distribution was extremely small.

When a distance between the measurement result of Example 1 in FIG. 8 and the measurement result of Reference example 1 in FIG. 8 was obtained, the gap diameter (nm) and log differential pore capacity distribution of the air gaps can be evaluated for only the binder layer of Example 1. Moreover, in a similar way, when a distance between the measurement result of Example 3 and the measurement result of Reference example 1 was obtained, the gap diameter (nm) and log differential pore capacity distribution of the air gaps can be evaluated for only the binder layer of Example 3.

From the difference between the measurement results of Example 1 and Reference example 1 in FIG. 8, it was found that the binder layer of Example 1 included an extremely large amount of nanogaps which are air gaps with an average diameter of 300 nm or less.

Moreover, from the difference between the measurement results of Example 3 and Reference example 1 in FIG. 8, it was found that the binder layer of Example 3 included a somewhat large amount of nanogaps which are air gaps with an average diameter of 300 nm or less.

(Evaluation of Peeling Strength of Wavelength Converter)

For each of the wavelength conversion members (wavelength conversion members No. 1 and No. 2) of Example 1 and Example 3, a peeling strength of the wavelength converter was evaluated. Specifically, a polyimide tape (made by 3M Corporation) was pasted to each of the wavelength converters of the wavelength conversion members, and thereafter, was peeled off by pinching an end of the pasted tape. In this way, it was observed whether the wavelength converter was peeled from the substrate.

In the wavelength conversion member No. 1 of Example 1, the wavelength converter was peeled in a part of a total area of the wavelength converter from which the tape was peeled off. In the wavelength conversion member No. 2 of Example 3, the wavelength converter was not peeled in a total area of the wavelength converter from which the tape was peeled off.

Evaluation Comparison Between Example 1 and Example 3

From the above-described evaluation results of Example 1 and Example 3, it was found that the binder layer of the wavelength conversion member of Example 3 included a larger amount of the nanogaps than the binder layer of the wavelength conversion member of Example 1.

Moreover, it was found that the wavelength conversion member of Example 3 had a higher mechanical strength of the wavelength converter and a higher peeling strength thereof to the substrate than the wavelength conversion member of Example 1.

The entire contents of Japanese Patent Application No. 2017-034968 (filed on: Feb. 27, 2017) and Japanese Patent Application No. 2017-126169 (filed on: Jun. 28, 2017) are incorporated herein by reference.

Although the contents of this embodiment have been described above in accordance with the examples, it is obvious to those skilled in the art that this embodiment is not limited to the description of these and that various modifications and improvements are possible.

INDUSTRIAL APPLICABILITY

In accordance with the wavelength conversion member according to the present invention, there is obtained such a wavelength conversion member in which light extraction efficiency and a power density of output light are high even if being irradiated with excitation light having a high power density.

REFERENCE SIGNS LIST 1, 1A, 1B, 100 Wavelength conversion member
10 Substrate
20 Light reflecting film
30, 30A, 30B, 130 Wavelength converter
40, 140 Phosphor particle
50, 50A, 50B, 150 Binder layer
51 Nanoparticle
52 Fixed body of nanoparticles
55 Fixing assistance substance
58 Nanogap
60, 60A, 60B Excitation light
70 Fluorescent light
71, 81 Output light
72, 82 In-plane guided light
73, 83 Light loss in light reflecting film 20
90A, 90B Output light spot diameter

The invention claimed is:

1. A wavelength conversion member comprising:
a substrate;
a wavelength converter including phosphor particles excited by excitation light and a binder layer that fixes or adheres the adjacent phosphor particles to one another, the wavelength converter being provided on a front surface side of the substrate; and
a light reflecting film that reflects fluorescent light radiated by the phosphor particles, the light reflecting film being provided on at least a part of an interface between the substrate and the wavelength converter,
wherein a refractive index of the phosphor particles is larger than a refractive index of the binder layer,
the binder layer includes a composite hardened body that includes nanoparticles including magnesium fluoride and a fixing assistance substance that covers the nanoparticles and bonds a plurality of the nanoparticles while permeating each gap between the adjacent nanoparticles, and
the fixing assistance substance includes silica glass and nanogaps which are voids with an average diameter of 300 nm or less.

2. The wavelength conversion member according to claim 1,
wherein the binder layer includes nanogaps which are voids with an average diameter of 300 nm or less in an inside.

3. The wavelength conversion member according to claim 1,
wherein the refractive index of the binder layer is 1.43 or less.

4. The wavelength conversion member according to claim 1,
wherein the binder layer is composed of an inorganic substance.

5. The wavelength conversion member according to claim 1,
wherein the excitation light is a laser beam.

6. The wavelength conversion member according to claim 1,
wherein an average particle size of the phosphor particles is 100 μm or less.

7. The wavelength conversion member according to claim 1,
wherein the binder layer includes nanoparticles with an average particle size of 100 nm or less.

8. The wavelength conversion member according to claim 1,
wherein the binder layer is composed of a fixed body of nanoparticles.

9. The wavelength conversion member according to claim 1,
wherein materials of the fixing assistance substance and the nanoparticles are same.

10. The wavelength conversion member according to claim 1,
wherein the binder layer includes microgaps which are air gaps with an average diameter exceeding 300 nm.

11. The wavelength conversion member according to claim 1,
wherein the fixing assistance substance includes silica glass using, as a precursor, at least either one of polysilazane and a polysilazane derivative.

12. The wavelength conversion member according to claim 1, wherein the fixing assistance substance includes silica glass using, as a precursor, at least either one of alkoxysilane and an alkoxysilane derivative and obtained by hydrolytic condensation of the precursor.

13. The wavelength conversion member according to claim 1,
wherein the substrate is a metal substrate.

* * * * *